(12) United States Patent
Rinne et al.

(10) Patent No.: US 11,799,061 B2
(45) Date of Patent: *Oct. 24, 2023

(54) DISPLAYS WITH UNPATTERNED LAYERS OF LIGHT-ABSORBING MATERIAL

(71) Applicant: X Display Company Technology Limited, Dublin (IE)

(72) Inventors: Glenn Arne Rinne, New Hill, NC (US); Christopher Andrew Bower, Raleigh, NC (US); Matthew Alexander Meitl, Durham, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 97 days.

This patent is subject to a terminal disclaimer.

(21) Appl. No.: 17/405,664

(22) Filed: Aug. 18, 2021

(65) Prior Publication Data

US 2021/0384389 A1    Dec. 9, 2021

Related U.S. Application Data

(63) Continuation of application No. 16/669,493, filed on Oct. 30, 2019, now Pat. No. 11,127,889.

(51) Int. Cl.
*H01L 33/56* (2010.01)
*H01L 23/544* (2006.01)

(52) U.S. Cl.
CPC ............ *H01L 33/56* (2013.01); *H01L 23/544* (2013.01); *H01L 2223/54426* (2013.01); *H01L 2933/005* (2013.01); *H01L 2933/0066* (2013.01)

(58) Field of Classification Search
CPC .................. H01L 33/56; H01L 23/544; H01L 2223/54426; H01L 2933/005; H01L 2933/0066
See application file for complete search history.

(56) References Cited

U.S. PATENT DOCUMENTS 6,142,358 A    11/2000  Cohn et al.
7,195,733 B2    3/2007  Rogers et al.
(Continued)

OTHER PUBLICATIONS

Bower, C. A. et al., Micro-Transfer-Printing: Heterogeneous Integration of Microscale Semiconductor Devises using Elastomer Stamps, IEEE Conference, (2014).
(Continued)

*Primary Examiner* — Shaun M Campbell
(74) *Attorney, Agent, or Firm* — Choate, Hall & Stewart LLP; Michael D. Schmitt

(57) ABSTRACT

A method of making a display structure comprises providing a display substrate having a display surface, disposing components on and in contact with the display surface, uniformly blanket coating the display surface with a curable layer of uncured light-absorbing material, and curing the curable layer of uncured light-absorbing material to provide a layer of cured light-absorbing material so that the components project from the layer of cured light-absorbing material without having pattern-wise etched the layer of cured light-absorbing material after the light-absorbing material has been cured. The uniform blanket coating has a thickness greater than a thickness of the component, disposing the components comprises printing the components through the uniform blanket coating such that the components protrude from the uniform blanket coating, or the component is coated with a de-wetting material.

24 Claims, 25 Drawing Sheets

(56) References Cited

U.S. PATENT DOCUMENTS

| | | |
|---|---|---|
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,333,860 B1 | 12/2012 | Bibl et al. |
| 8,470,701 B2 | 6/2013 | Rogers et al. |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2* | 11/2014 | Bower ............... H01L 21/6838 257/737 |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2* | 3/2017 | Higginson ............... H01L 33/42 |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,818,725 B2 | 11/2017 | Bower et al. |
| 9,865,832 B2 | 1/2018 | Bibl et al. |
| 9,929,053 B2 | 3/2018 | Bower et al. |
| 9,991,163 B2 | 6/2018 | Bower et al. |
| 10,008,483 B2 | 6/2018 | Cok et al. |
| 10,262,966 B2 | 4/2019 | Bower |
| 10,468,363 B2 | 11/2019 | Prevatte et al. |
| 11,127,889 B2* | 9/2021 | Rinne ............... H01L 25/0753 |
| 2003/0141570 A1 | 7/2003 | Chen et al. |
| 2010/0306993 A1 | 12/2010 | Mayyas et al. |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2015/0028362 A1 | 1/2015 | Chan et al. |
| 2015/0179586 A1* | 6/2015 | Youk ............... G02F 1/133512 427/58 |
| 2016/0093600 A1 | 3/2016 | Bower et al. |
| 2016/0351539 A1* | 12/2016 | Bower ............... H01L 33/44 |
| 2017/0122502 A1 | 5/2017 | Cok et al. |
| 2017/0338374 A1* | 11/2017 | Zou ............... H01L 25/0753 |
| 2017/0345801 A1* | 11/2017 | Lin ............... H01L 25/075 |
| 2019/0206849 A1* | 7/2019 | Jang ............... H01L 33/405 |
| 2021/0265327 A1* | 8/2021 | Koo ............... H01L 33/62 |

OTHER PUBLICATIONS

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

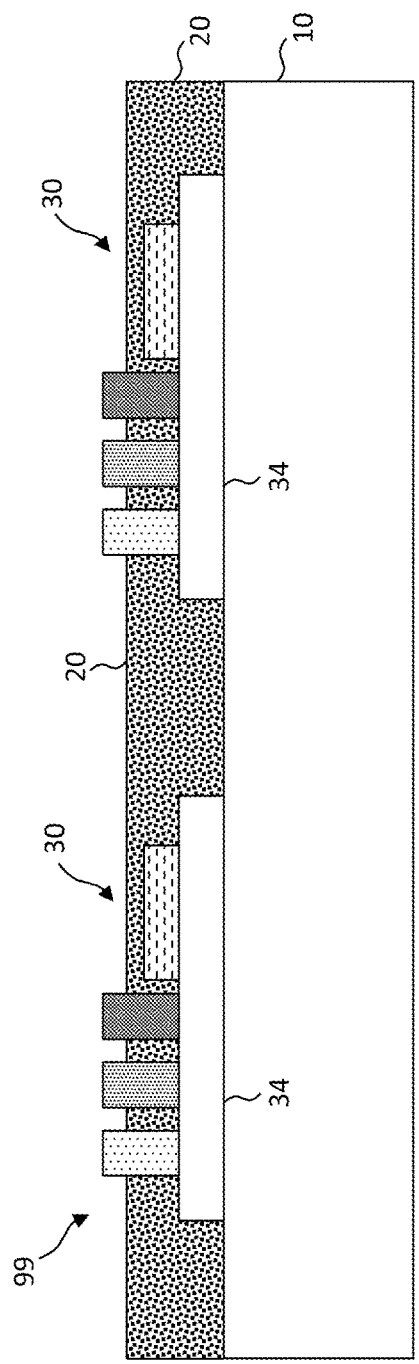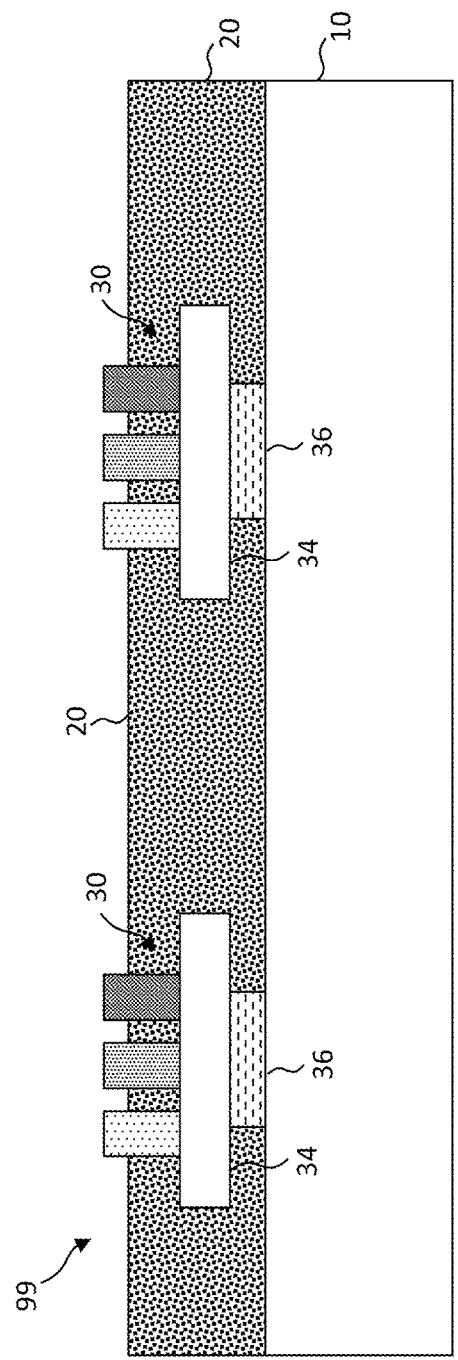

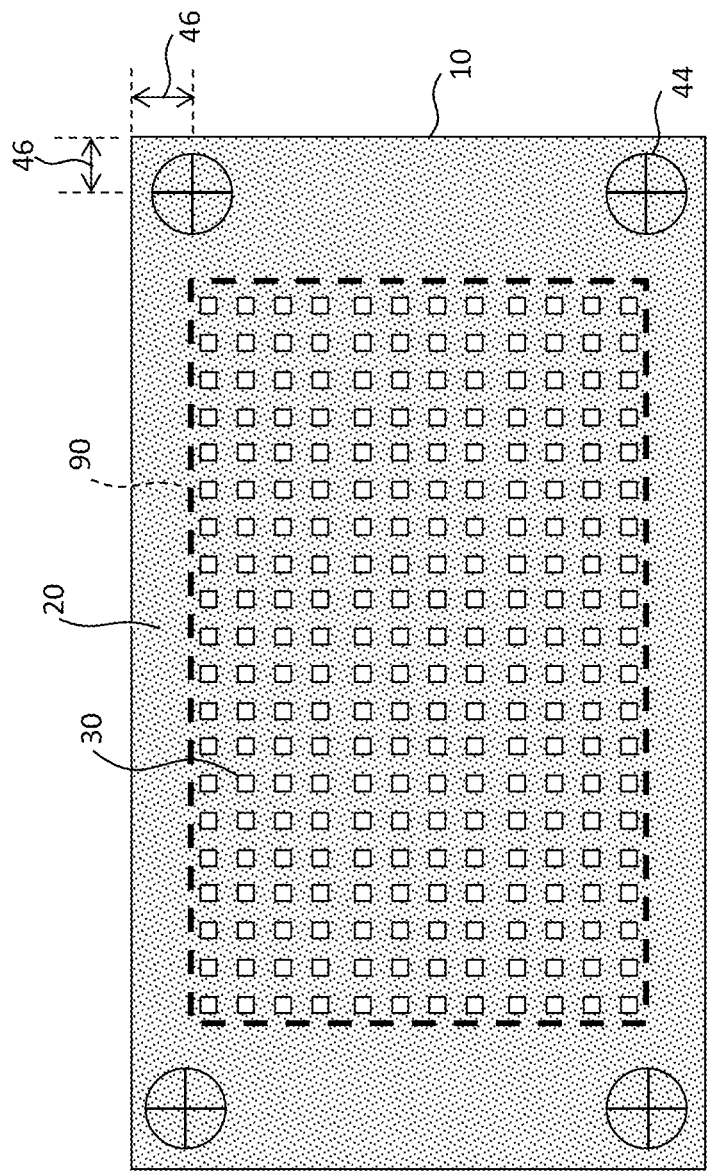

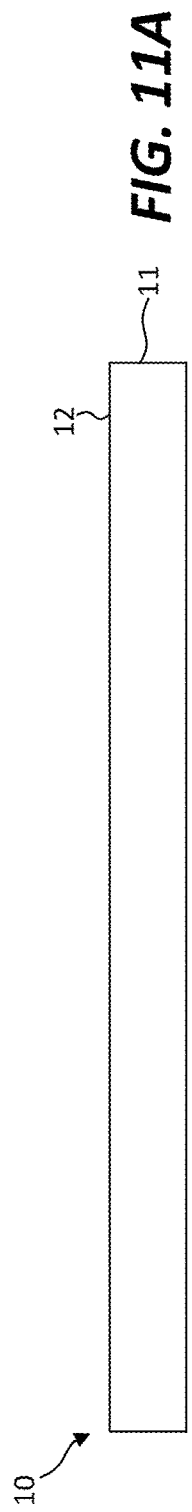
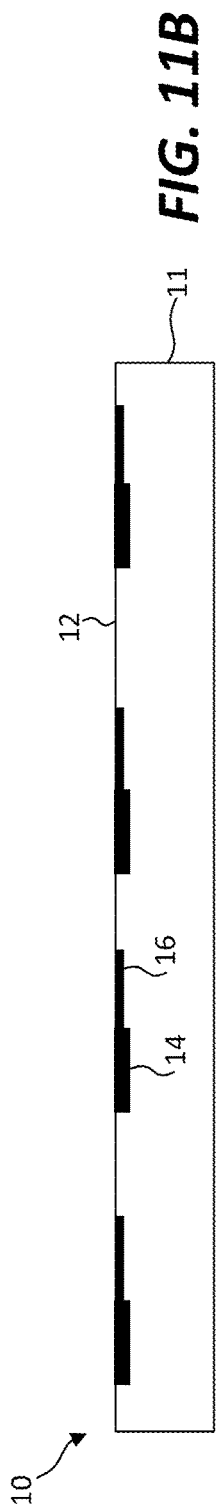
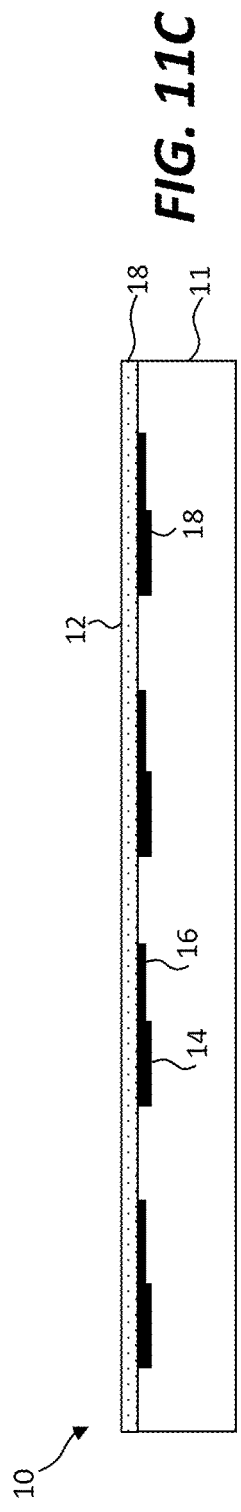
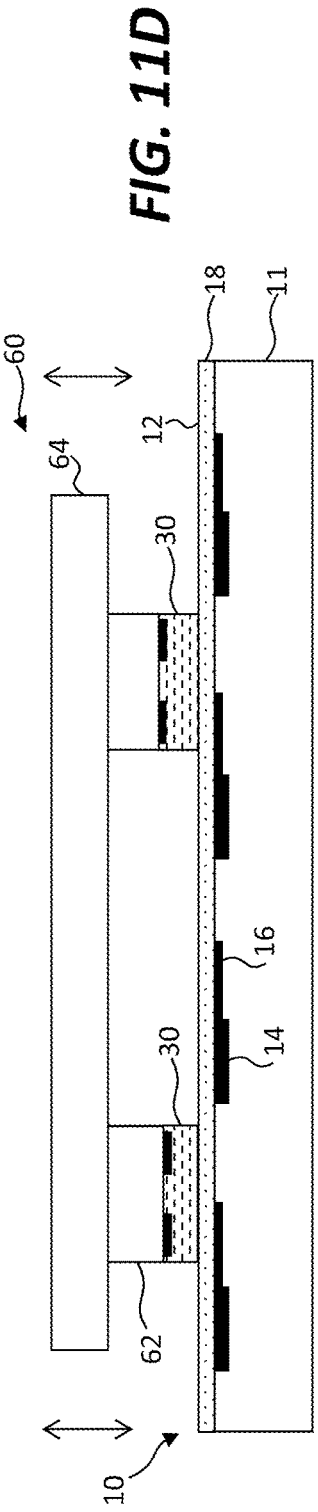

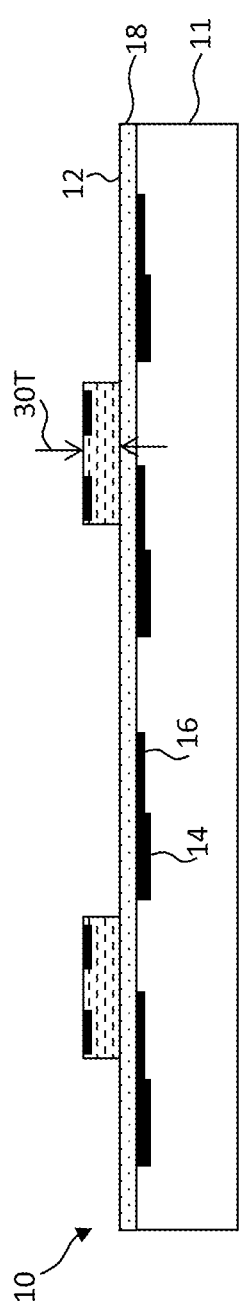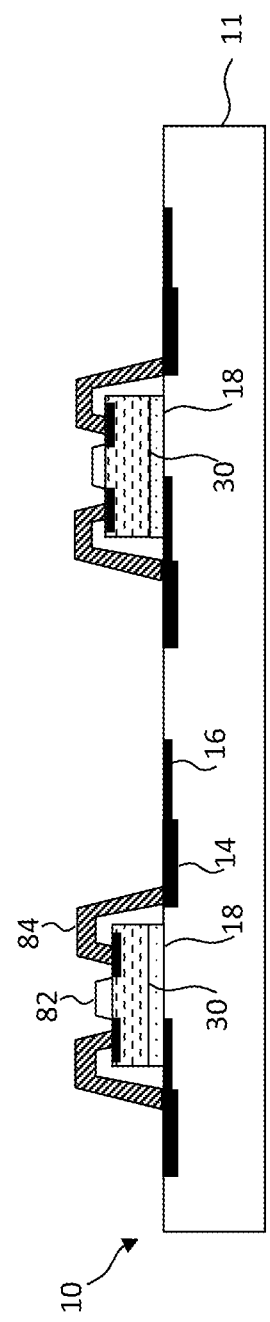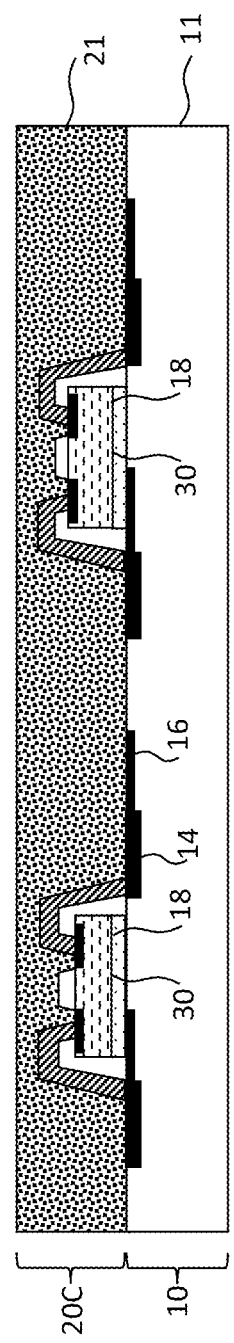

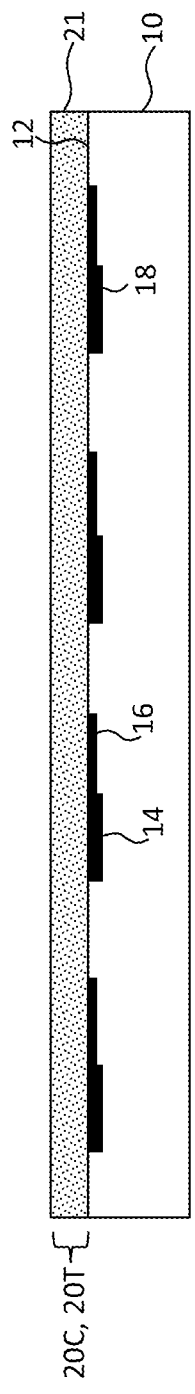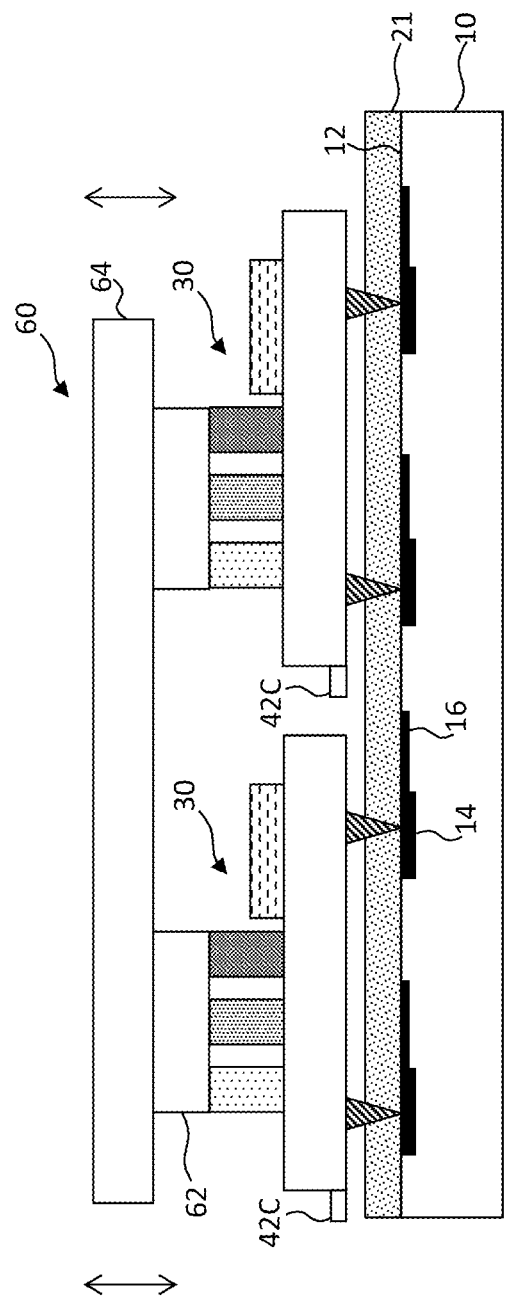

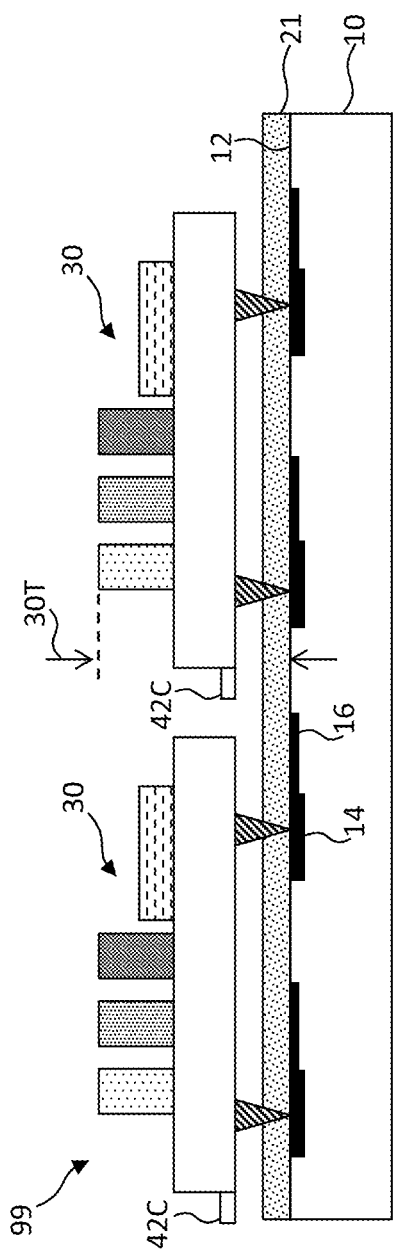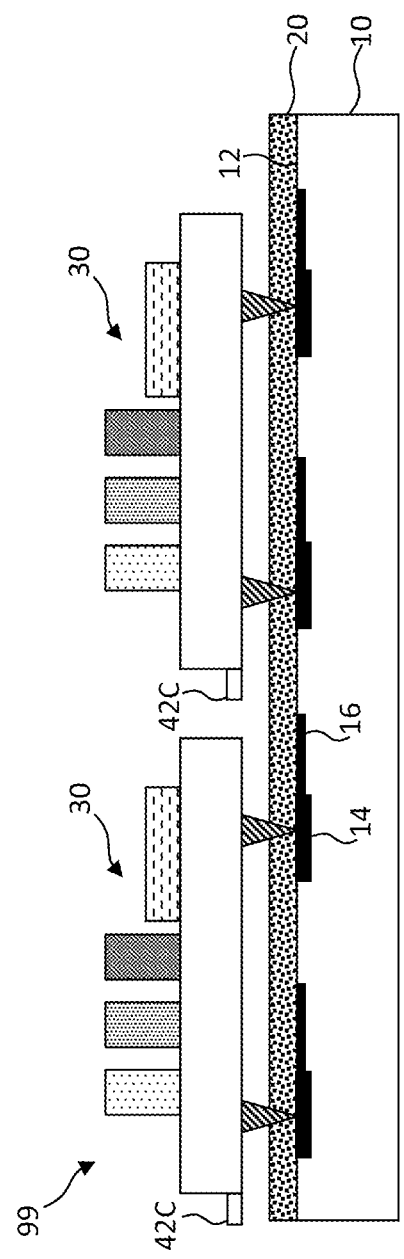

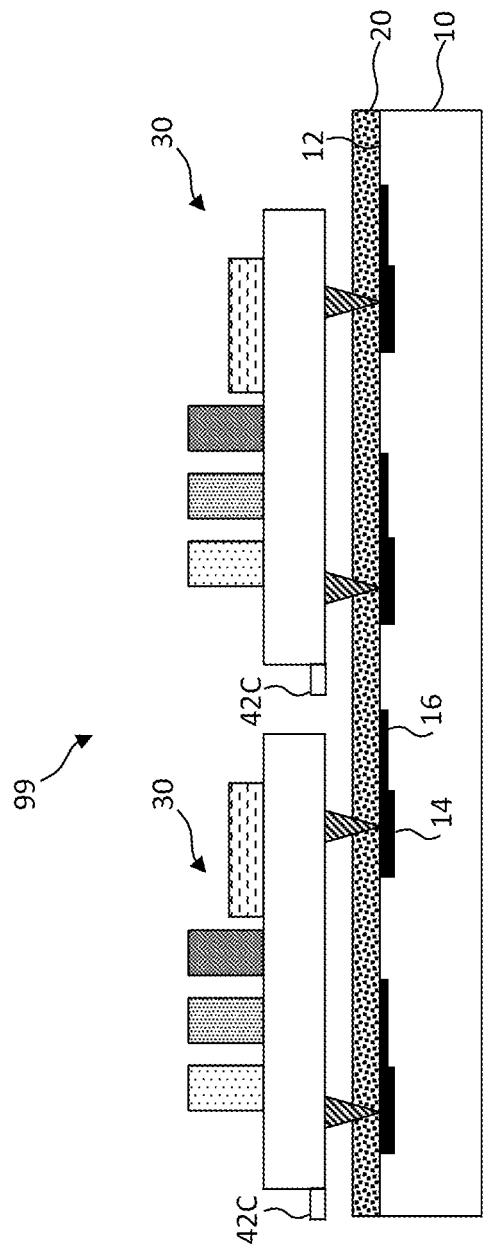

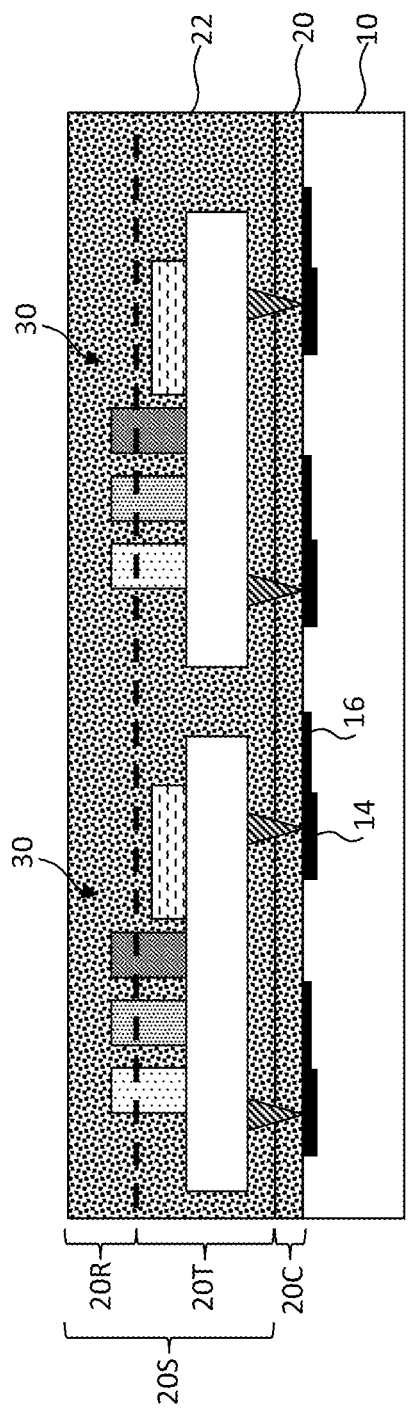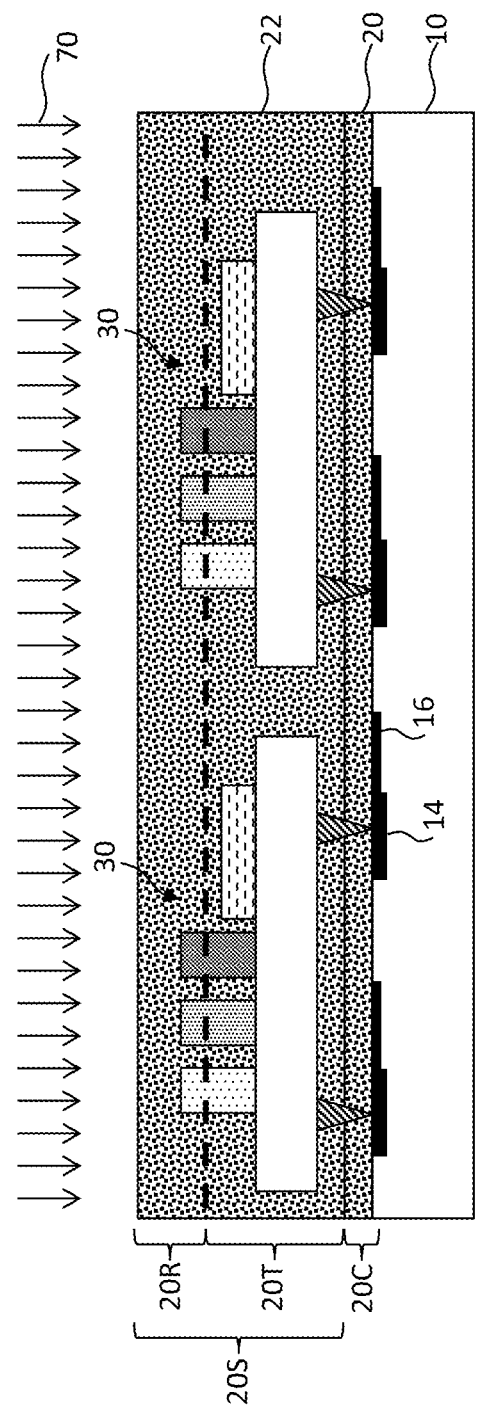

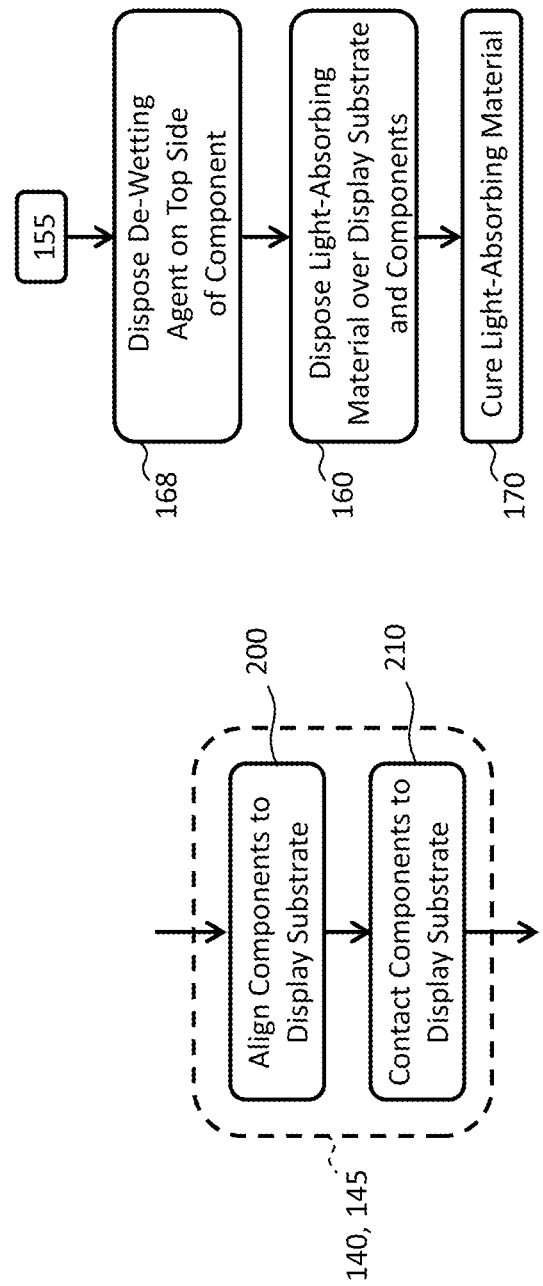

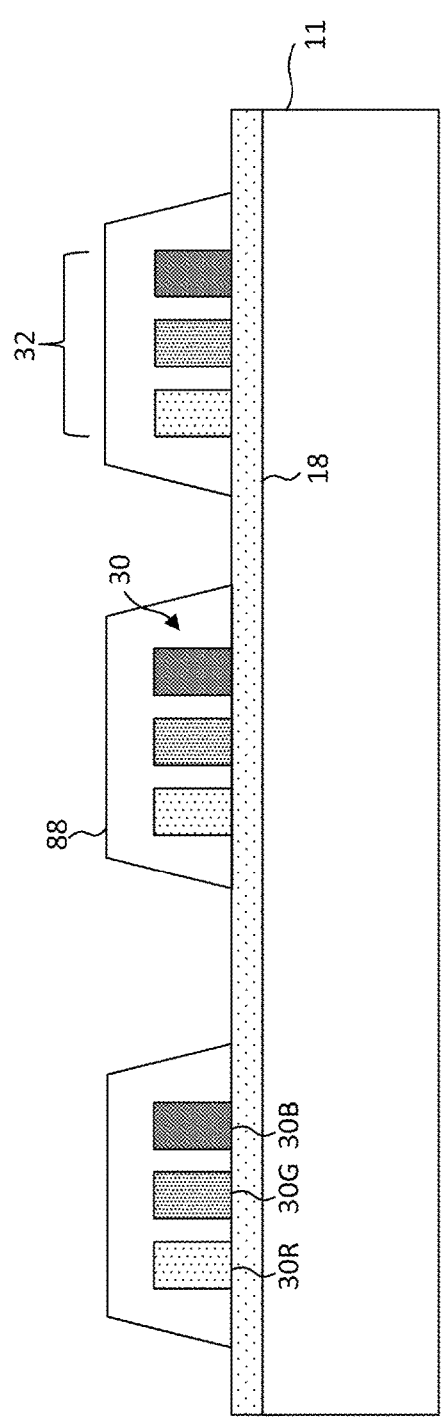
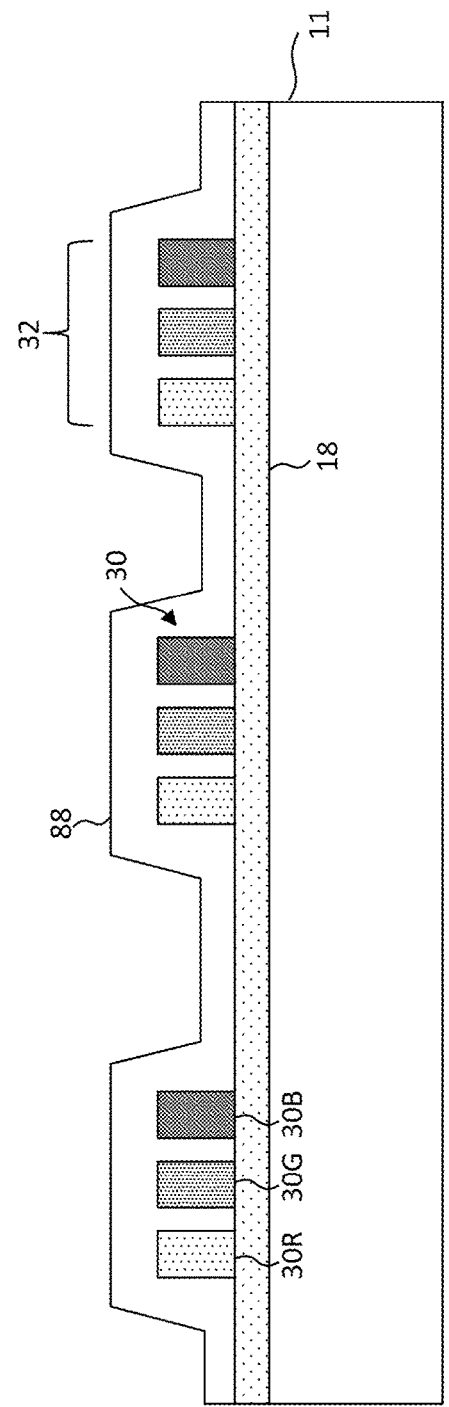
FIG. 18A
FIG. 18B

DISPLAYS WITH UNPATTERNED LAYERS OF LIGHT-ABSORBING MATERIAL

PRIORITY APPLICATION

The present application is a continuation of U.S. patent application Ser. No. 16/669,493, filed on Oct. 10, 2019, the content of which is hereby incorporated by reference herein in its entirety.

TECHNICAL FIELD

The present disclosure relates to displays (e.g., micro-LED displays) and in particular to light-absorbing material structures and methods for making such structures for use in displays.

BACKGROUND

Emissive information displays employ controllable light emitters to display information. For example, liquid crystal displays control light output from a backlight and organic light-emitting diodes use thin films of organic materials that emit light when electrical current passes through the organic films. When viewed in an environment with substantial ambient light, the reflected ambient light can reduce the contrast of such displays, making it difficult to perceive the information presented on the display. To reduce the reflected ambient light and improve the contrast of a display, a "black matrix" is typically provided over the display and between the display pixels to absorb the ambient light without occluding light emitted from the display pixels. In some designs, the black matrix is provided as part of a color filter layer. Black matrix materials, such as resins incorporating carbon black or neutral-colored light-absorbing pigments, are typically coated on a surface and then pattern-wise etched to remove portions of the black matrix and expose the pixels, so that light emitted by the pixels can escape the display and be seen by a viewer. This subtractive approach to constructing a black matrix is wasteful and inefficient, since etching the coated black matrix requires additional manufacturing steps and the removed materials are lost, thereby increasing costs.

Light-emitting diode (LED) displays have many advantages as a display technology, including brightness, efficiency, saturated color emission, and environmental robustness. Most commercially available LED displays comprise relatively large LEDs patterned at a low resolution, for example 25 ppi or having a pitch of approximately one millimeter. More recently, displays with micro-LEDs and much greater resolution have been disclosed. For example, U.S. Pat. No. 8,722,458 entitled "Optical Systems Fabricated by Printing-Based Assembly" teaches transferring light-emitting, light-sensing, or light-collecting semiconductor elements from a wafer substrate to a destination substrate, U.S. Pat. No. 9,991,163 entitled "Small Aperture Ratio Display with Electrical Component" discusses micro-LED displays, and U.S. Pat. No. 9,818,725 entitled "Inorganic-Light-Emitter Display with Integrated Black Matrix" discloses the use of a black matrix with micro-LED displays.

However, there remains a need for reducing ambient light reflection and corresponding efficient manufacturing methods for constructing black matrix structures in micro-LED displays.

SUMMARY

Structures and methods disclosed herein can require less material, use simpler manufacturing processes by making use of unpatterned deposition and etching of light-absorbing material, such as black matrix material, in a display. In some embodiments, light-absorbing material is deposited using an unpatterned process, such as spin coating, curtain coating, or spray coating for example. In some embodiments, a portion of the light-absorbing material is then removed using an unpatterned etch without masking so that light can be emitted without occlusion and seen by a viewer, for example from pixels on a display substrate.

In some embodiments of the present disclosure, a display structure comprises a display substrate having a display surface. A layer of light-absorbing material is disposed on the display surface. The layer of light-absorbing material has a layer thickness. Components are disposed on or over the display surface and have a component thickness greater than the layer thickness, so that the components protrude (e.g., project or extend) from the layer of light-absorbing material. In some embodiments, the components protrude from the layer of (e.g., cured) light-absorbing material (e.g., a display black matrix) without having pattern-wise etched the layer of (e.g., cured) light-absorbing material after the light-absorbing material has been cured. In some embodiments, the curable layer of uncured light-absorbing material (e.g., the uniform blanket coating) has a thickness greater than a thickness of the component. In some embodiments, disposing the components comprises printing the components after uniformly blanket coating the display surface with the curable layer of uncured light-absorbing material such that at least a portion of each of the components extends completely through the curable layer of uncured light-absorbing material (e.g., the uniform blanket coating) and the components protrude through the curable layer of uncured light-absorbing material. In some embodiments, the components are each coated with a de-wetting material.

According to some embodiments, the curable layer of uncured light-absorbing material (the uniform blanket coating) has a coating thickness greater than a component thickness that is a thickness (e.g., a greatest thickness) of each of the components such that uniformly blanket coating the components covers the components with the curable layer of uncured light-absorbing material. Some embodiments comprise unpatterned etching the layer of cured light-absorbing material, such that the components protrude from the layer of cured light-absorbing material only after the unpatterned etching.

Some methods of the present disclosure comprise removing a top portion of the layer of cured light-absorbing material with an unpatterned etch leaving a remaining portion of the layer of cured light-absorbing material, so that the remaining portion of cured light-absorbing material has a layer thickness greater than zero and less than the component thickness and the components project from the remaining portion of the layer of cured light-absorbing material. The components can have a component thickness that is a thickness of the components and the uniform blanket coating can have a coating thickness less than the component thickness, and disposing the components can comprise printing the components completely through the uniform blanket coating such that the components protrude from the uniform blanket coating. The display substrate can comprise a support and an adhesive layer disposed on the support. The adhesive layer can have an adhesive layer surface that is, for example, the display surface. At least a portion of each component can extend through the adhesive layer and contact the support.

Components can be passive or active electronic or optical devices. Each component can be a single integrated circuit or a structure comprising multiple devices such as multiple integrated circuits. The multiple integrated circuits can themselves comprise a variety of materials and functional devices. In some embodiments each component is a single light emitter such as a sub-pixel in a display. In some embodiments, the component is a pixel comprising multiple light emitters and a pixel controller. The light emitters can be light-emitting diodes (LEDs) or micro-light-emitting diodes (micro-LEDs). In some embodiments the components are light collectors, such as sensors or photovoltaic devices. Because the components protrude (e.g., project, extend, or stick out) from the layer of light-absorbing material, the layer of light-absorbing material does not occlude the components, so that the components can emit or collect light external to the display structure. Although described for clarity and simplicity as a display structure, embodiments of the present disclosure can include other structures in which ambient light absorption, light emission, or light collection is useful.

The display structure can comprise an adhesive layer disposed on the display substrate that adheres the components to the display substrate or the display substrate can comprise an adhesive layer that adheres the components to the display substrate. In some embodiments, the layer of light-absorbing material is disposed on the adhesive layer or the layer of light-absorbing material is adhesive or is an adhesive layer.

According to some embodiments of the present disclosure, the display substrate comprises a display area including all of the components and a registration area separate from the display area. The layer of light-absorbing material is disposed in the display area and not in the registration area. The registration area comprises a registration mark disposed on the display substrate. A barrier can be disposed on the display substrate that separates the display area from the registration area and light-absorbing material can be at least partially absent from the registration area to optically expose the registration mark.

In some embodiments, a registration mark is surrounded by and protrudes (e.g., projects or extends) from a layer of light-absorbing material. Such a registration mark can be a three-dimensional mark or be disposed on a mesa provided on the display substrate, where the mesa is higher than the layer of light-absorbing material over the display substrate surface.

In some embodiments, the display substrate comprises a pin registration structure or other mechanical structure which can be used to register a transfer device, such as a stamp or other micro-transfer printing device, to the display substrate.

In some embodiments, the display substrate comprises a registered edge that can be used to register the display substrate to a such as a stamp or other micro-transfer printing device, by the registered edge.

In some embodiments of the present disclosure, the display substrate comprises electrical connections electrically connected to the components, for example electrically conductive wires and electrical contact pads. In some embodiments, the components comprise connection posts that electrically connect circuits within the components to the electrical connections. The connection posts can extend through at least a portion of the layer of light-absorbing material. The light-absorbing material can be adhesive and can adhere the components to the display substrate.

Methods of making a display structure comprise providing a display substrate having a display surface, disposing components on and in contact with the display surface, uniformly blanket coating the display surface with a curable layer of uncured light-absorbing material, and curing the curable layer of uncured light-absorbing material to provide a layer of cured light-absorbing material so that the components protrude from the layer of cured light-absorbing material without pattern-wise etching the layer of cured light-absorbing material after the light-absorbing material has been cured. In some embodiments, the uniform blanket coating has a thickness greater than a thickness of the component or the component extends through the uniform blanket coating and at least a portion of the component protrudes from the uniform blanket coating in a direction opposite the display substrate.

According to some embodiments of the present disclosure, the display substrate comprises a support and an adhesive layer having an adhesive layer surface disposed on the support. The adhesive layer surface can be the display surface. The components can be provided on the adhesive layer, the adhesive layer surface, or the display surface. The components can be micro-transfer printed onto the adhesive layer, onto the display substrate, onto the display surface, or onto the support. In some embodiments, at least a portion of each component protrudes or extends through the adhesive layer and contacts the support. Each component can have a component thickness greater than a thickness of the adhesive layer.

In some embodiments, the step of uniformly blanket coating the display surface comprises coating a curable layer of uncured light-absorbing liquid material. The curable layer of uncured light-absorbing liquid material can be or comprise one or more of an uncured polymer, a resin, and an epoxy.

In some embodiments, the display substrate comprises contact pads disposed on or in the display surface and methods of the present disclosure comprise electrically connecting the components to the contact pads, for example using photo-lithographic methods or materials or micro-transfer printing.

According to some embodiments, methods of the present disclosure comprise disposing the components on the display surface so that each of the components protrudes from the display surface a component thickness, uniformly blanket coating the display surface and the components with the curable layer of uncured light-absorbing material to a coating thickness greater than the component thickness, and then curing the curable layer of uncured light-absorbing material to form the layer of cured light-absorbing material. A top portion of the layer of cured light-absorbing material can be removed with an unpatterned etch leaving a remaining portion of the layer of cured light-absorbing material, so that the remaining portion of cured light-absorbing material has a layer thickness greater than zero and less than the component thickness and each of the components protrudes from the remaining portion of the layer of cured light-absorbing material.

In some embodiments, methods of the present disclosure comprise coating at least a portion of each of the components (for example all of each component) with an optically clear and electrically insulating layer, for example before uniformly coating the components with a layer of light-absorbing material.

According to some embodiments, methods of the present disclosure comprise providing a display substrate having a display surface, uniformly blanket coating the display surface with the curable layer of uncured light-absorbing material to a coating thickness, disposing (e.g., micro-transfer printing) components onto the display substrate completely through the curable layer of uncured light-absorbing material (e.g., the uniform blanket coating) with a micro-transfer printing device so that the components extend through the curable layer of uncured light-absorbing material and the components protrude from the curable layer of uncured light-absorbing material in a direction away from the display substrate. The components have a component thickness greater than the coating thickness. The curable layer of uncured light-absorbing material is cured to form the layer of cured light-absorbing material, so that the components protrude from the cured layer of light-absorbing material. According to some embodiments of the present disclosure, the curable layer of uncured light-absorbing material is an adhesive layer.

The layer of cured light-absorbing material can be a first layer and the coating thickness can have a first coating thickness and methods of the present disclosure can further comprise blanket coating the first layer with a second curable layer of uncured light-absorbing material to a second coating thickness greater than a difference between the component thickness and the first coating thickness, curing the second curable layer of uncured light-absorbing material to form a second layer of cured light-absorbing material and, after curing the second layer, removing a top portion of the second layer of cured light-absorbing material leaving a remaining portion of the second layer of cured light-absorbing material, so that the remaining portion has a remaining layer thickness greater than zero and less than a difference between the component thickness and the first coating thickness and the components protrude from the second layer of cured light-absorbing material.

According to some embodiments, the display substrate comprises a display area and one or more registration areas separate from the display area, the one or more registration areas each comprising a registration mark disposed on the display substrate and methods of the present disclosure comprise uniformly blanket coating the curable layer of uncured light-absorbing material in the display area and at least partially not in the one or more registration areas. Some methods of the present disclosure comprise registering the display substrate to a micro-transfer printing device using one or more of the registration marks. According to some embodiments of the present disclosure, a corresponding barrier physically separates each of the one or more registration areas from the display area and uniformly blanket coating the curable layer of uncured light-absorbing material comprises physically contacting the uncured light-absorbing material against the corresponding barrier.

According to some embodiments, the display substrate comprises a pin registration structure or other mechanical registration structure disposed on or in the display substrate and methods of the present disclosure comprise registering the display substrate to a micro-transfer printing device using the pin registration structure or other mechanical registration structure. According to some embodiments, the display substrate comprises a registered edge and methods of the present disclosure comprise registering the display substrate to a micro-transfer printing device using the registered edge.

According to some embodiments, the display substrate comprises one or more contact pads on or in the display surface and each of the components comprises one or more connection posts and methods of the present disclosure comprise printing (e.g., micro-transfer printing) the components and pressing the one or more connection posts of each of the components completely through the curable layer of uncured light-absorbing material and onto or into a corresponding one of the one or more contact pads to form an electrical contact between each of the one or more connection posts and the corresponding one of the one or more contact pads.

According to some embodiments of the present disclosure, a method of making a display structure comprises providing a display substrate having a display surface, disposing components on and in contact with the display surface so that the components protrude from the display surface a component thickness, uniformly blanket coating the display surface with a curable layer of uncured light-absorbing material to a coating thickness greater than the component thickness, curing the curable layer of uncured light-absorbing material to form a layer of cured light-absorbing material, and removing a top portion of the layer of cured light-absorbing material with an unpatterned etch leaving a remaining portion of the cured layer of light-absorbing material, so that the remaining portion has a layer thickness greater than zero and less than the component thickness and each of the components protrudes from the remaining portion of the cured layer of light-absorbing material.

According to some embodiments of the present disclosure, a method of making a display structure comprises providing a display substrate having a display surface, uniformly blanket coating the display surface with a curable layer of uncured light-absorbing material to a coating thickness, micro-transfer printing components onto the display substrate through the curable layer of uncured light-absorbing material with a micro-transfer printing device, each of the components having a component thickness greater than the coating thickness, and then curing the curable layer of uncured light-absorbing material to provide a layer of cured light-absorbing material so that each of the components protrudes from the layer of cured light-absorbing material without pattern-wise etching the layer of cured light-absorbing material. Thus, according to some methods, only the one or more light emitters protrude from the layer of cured light-absorbing material after the curing.

Methods of the present disclosure can comprise disposing the components on the display surface so that the components protrude from the display surface a component thickness, disposing a de-wetting agent or material on a top side of each of the components opposite the display surface, uniformly blanket coating the display surface and each of the components with the curable layer of uncured light-absorbing material to a coating thickness less than the component thickness, the uncured light-absorbing material on the components wicking from the top side of the components, and curing the curable layer of uncured light-absorbing material to form the layer of cured light-absorbing material, so that the layer of cured light-absorbing material has a layer thickness greater than zero and less than the component thickness and each of the components protrudes from the layer of cured light-absorbing material.

Thus, according to some embodiments of the present disclosure, methods of making a display structure can comprise providing a display substrate having a display surface, disposing components on and in contact with the display surface so that each of the components protrudes from the display surface a component thickness, disposing a de-wetting agent or material on a top side of each of the components opposite the display surface, uniformly blanket coating the display surface with a curable layer of uncured light-absorbing material to a coating thickness greater than the component thickness, and curing the curable layer of uncured light-absorbing material to form a layer of cured light-absorbing material, so that the cured layer of light-absorbing material has a layer thickness greater than zero and less than the component thickness and each of the components protrudes from the remaining portion of the cured layer of light-absorbing material.

Some methods comprise pattern-wise coating each of the components with the de-wetting material after the components are disposed on and in contact with the display surface. According to some embodiments, each of the components protrudes from the layer of cured light-absorbing material without having pattern-wise etched the layer of cured light-absorbing material. Thus, embodiments of the present disclosure comprise blanket coating the display surface and the de-wetting material with the curable layer of uncured light-absorbing material to a coating thickness, wherein the uncured light-absorbing material wicks from the de-wetting material and curing the curable layer of uncured light-absorbing material to form the layer of cured light-absorbing material, so that the layer of cured light-absorbing material has a layer thickness greater than zero and less than a thickness of the components such that each of the components protrudes from the layer of cured light-absorbing material. The coating thickness can be less than a thickness of the components. Each of the components can comprise one or more light emitters and the one or more light emitters can be operable to emit light through the de-wetting material away from the display substrate.

In some embodiments, methods of the present disclosure comprise coating each of the components with an optically clear and electrically insulating layer, for example before uniformly coating the components with a layer of light-absorbing material.

In some embodiments of the present disclosure, the components are light emitters, the components are pixels comprising one or more light emitters and a pixel substrate, or the pixels each comprise an unpackaged, bare die controller.

According to some embodiments of the present disclosure, a method of making a display structure comprises providing a display substrate having a display surface, disposing components on and in contact with the display surface, wherein the components are each coated with a de-wetting material, coating the display surface with a curable layer of uncured light-absorbing material, and curing the curable layer of uncured light-absorbing material to provide a layer of cured light-absorbing material. At least a portion of the de-wetting material protrudes from the layer of cured light-absorbing material after the light-absorbing material has been cured, without having pattern-wise etched the layer of cured light-absorbing material. Coating the display surface can comprise uniformly blanket coating the display surface.

According to embodiments of the present disclosure, a display structure comprises a display substrate having a display surface, one or more contact pads disposed in or on the display surface, pixels disposed on the display surface, wherein each of the pixels comprises a component substrate, one or more light emitters, one or more electrically conductive connection posts, and a layer of cured light-absorbing material disposed on the display substrate, wherein each of the one or more connection posts extends through the layer of cured light-absorbing material and is in electrical and physical contact with one of the one or more contact pads, and wherein the one or more light emitters protrude from the layer of cured light-absorbing material.

In some embodiments, the layer of cured light-absorbing material is in contact with, covers, or is in contact with and covers the component substrate of each of the pixels. In some embodiments, the layer of cured light-absorbing material has a coating thickness greater than a combined thickness of the one or more connection posts and the component substrate.

In some embodiments, the pixels each comprise a controller. In some embodiments, a top surface of the layer of cured light-absorbing material is above a top surface of the controller, e.g., so that layer of cured light-absorbing material is in contact with or covers the controller, or both. A top surface is a surface on an opposite side from the display substrate. In some embodiments, the one or more light emitters each have one or more of (i) a height to width aspect ratio and (ii) a height to length aspect ratio of greater than 1. In some embodiments, only the one or more light emitters protrude from the layer of cured light-absorbing material after the curing.

According to embodiments of the present disclosure, a display structure comprises a display substrate having a display surface that comprises one or more registration areas and a separate display area, wherein each of the one or more registration areas comprises a registration mark or a pin registration structure disposed in each of the one or more registration areas, components disposed on and in contact with the display surface, and a layer of light-absorbing material having a uniform thickness disposed on the display surface, wherein the layer of light-absorbing material is in contact with the components. The components protrude from the layer of light-absorbing material. In some embodiments, each of the one or more registration areas comprises the registration mark or pin registration structure. Thus, in some embodiments a registration mark is disposed in each of the one or more registration areas and in some embodiments a pin registration structure is disposed in each of the one or more registration areas.

According to some embodiments, the layer of cured light-absorbing material comprises a plurality of successively formed sublayers of cured light-absorbing material.

In some embodiments, the display structure comprises a corresponding barrier for each of the one or more registration areas. The layer of light-absorbing material is in contact with the barrier and is not in contact with at least a portion of the registration area. In some embodiments, the layer of light-absorbing material is in contact with the registration mark or the pin registration structure. In some embodiments, the components are pixels each comprising one or more light emitters and the one or more light emitters protrude from the layer of light-absorbing material. In some embodiments, the pixels each comprise a component substrate and the layer of light-absorbing material is in contact with or covers the component substrate, or both. In some embodiments, the pixels each comprise a controller and the layer of light-absorbing material is in contact with or covers the controller, or both.

According to embodiments of the present disclosure, a display structure comprises a display substrate having a display surface, one or more light emitters disposed on and in contact with the display surface, an optically clear electrical insulator disposed over the one or more light emitters, and a uniformly coated layer of light-absorbing material, wherein the one or more light emitters, the optically clear electrical insulator, or both the one or more light emitters and the optically clear electrical insulator protrude through the uniformly coated layer of light-absorbing material. The display substrate can comprise an adhesive layer and a surface of the adhesive layer can be the display surface. In some embodiments, the optically clear electrical insulator can be disposed in a patterned layer. In some embodiments, the optically clear electrical insulator can be disposed in an unpatterned layer.

According to some embodiments, the one or more light emitters are disposed on a component substrate disposed on the display surface. According to some embodiments, a display structure comprises a controller disposed on the component substrate. According to some embodiments, the one or more light emitters are electrically connected to one or more contact pads disposed on or in the display surface through one or more connection posts.

The present disclosure provides methods for making structures that reduce ambient light reflection from a flat-panel display, such as a light-emissive micro-LED display.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 4, 5, and 6 are cross sections of display structures according to some illustrative embodiments of the present disclosure;

FIGS. 9A-9D are plan views of display structures comprising registration structures according to some illustrative embodiments of the present disclosure;

FIGS. 11A-11I are sequential steps illustrating structures according to some illustrative embodiments of the present disclosure;

FIGS. 13A-13E are sequential steps illustrating structures according to some illustrative embodiments of the present disclosure;

FIGS. 14A-14C are optional sequential steps illustrating structures according to some illustrative embodiments of the present disclosure;

FIG. 15 is a flow diagram illustrating a transfer printing process according to some illustrative embodiments of the present disclosure;

FIG. 16 is a flow diagram illustrating a transfer printing process according to some illustrative embodiments of the present disclosure;

FIGS. 18A-18B are sequential steps illustrating structures according to some illustrative embodiments of the present disclosure;

Figure 1:
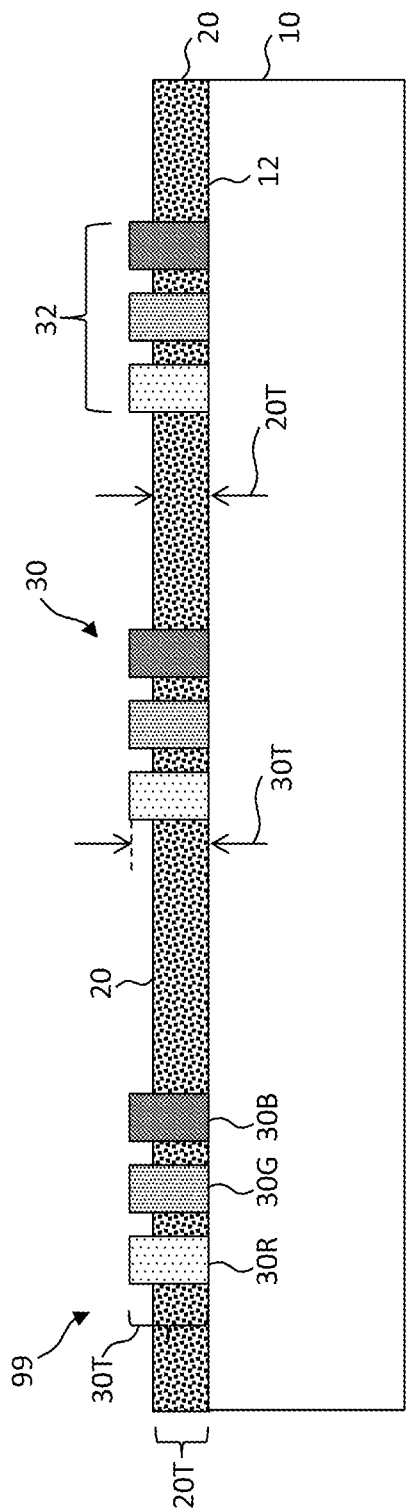
FIG. 1 is a cross section of a display structure according to some illustrative embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

In some embodiments of the present disclosure, inter alia, and referring to the cross section of FIG. 1, a display structure 99 comprises a display substrate 10 having a display surface 12. A layer 20 of light-absorbing material is disposed on display surface 12 and has a layer thickness 20T. Components 30 are disposed on and in contact with display surface 12, for example in a regular array. Components 30 have a component thickness 30T greater than layer thickness 20T, so that components 30 protrude (e.g., project, stick out, or extend) from layer 20 of light-absorbing material (e.g., a black matrix). Layer 20 of light-absorbing material can be a black matrix material. In some embodiments, a layer 20 of light-absorbing material is disposed over or on a display substrate 10 to absorb ambient light and does not occlude light emitted from any display light emitters or reflectors (e.g., light-emitting diodes 30 in pixels 32).

FIG. 1 shows components 30 as including three light-emitting diodes (LEDs) 30R, 30G, 30B that emit red, green, and blue light (collectively LEDs 30), respectively, per pixel 32. In some embodiments, pixels 32 include additional light emitters 30 such as a yellow LED 30 that emits yellow light.

Display substrate 10 can be any suitable substrate, for example a display substrate made of glass, plastic, sapphire, quartz, ceramic, metal, or a semiconductor substrate such as are found in the integrated circuit and flat-panel display industries. Display substrate 10 can have substantially planar opposing sides, on one side of which layer 20 of light-absorbing material and components 30 are disposed. Display substrate 10 can be substantially transparent to light, for example at least 50% (e.g., at least 75%, 80%, 90%, 95%, or 98% or more) transparent to visible light. Display substrate 10 can be provided with electrical conductors, contact pads, and circuitry electrically connected to components 30 to control components 30 (for example as shown in FIG. 11C below).

Layer 20 of light-absorbing material can be a layer of any suitable light-absorbing material. A light-absorbing material can be, for example, a black matrix material, such as a material comprising carbon black or a black pigment, or can be a material comprising a light-absorbing dye. In some embodiments, light-absorbing material absorbs at least 80%, at least 90%, at least 95%, or at least 99% of incident visible light. According to some embodiments, layer 20 of cured light-absorbing material comprises a plurality of successively formed sublayers of cured light-absorbing material. Light-absorbing material can be or include a polymer, resin, or epoxy. Light-absorbing material can be, but is not necessarily, a curable material (e.g., such that layer 20 of light-absorbing material is, in some embodiments, a curable layer). In some embodiments, light-absorbing material is provided as a liquid, disposed on display substrate 10, and then cured, for example by exposing layer 20 of light-absorbing material to light such as ultra-violet light or heat. Components 30 can protrude from layer 20 of cured light-absorbing material after the light-absorbing material has been cured.

Light-absorbing material can comprise cross-linking agents or molecules for converting light-absorbing material from a liquid to a solid state when cured. According to some embodiments of the present disclosure, a layer 20 of cured light-absorbing material can be only partially cured (e.g., to provide relatively increased rigidity and stability, or both) and a final hard cure can be performed, for example by baking, after display structure 99 is assembled or constructed.

Components 30 can be any of a wide variety of structures and devices and can comprise a wide variety of materials. Components 30 can be passive or active components. Components 30 can be electronic, optical, or optoelectronic devices, for example. Each component 30 can be a single integrated circuit or a structure comprising multiple devices such as multiple integrated circuits. A single integrated circuit or multiple integrated circuits can comprise a variety of materials and functional devices. In some embodiments, each component 30 is an individual and separate device and display structure 99 comprises multiple different components. For example, in some embodiments each component 30 is a single light emitter such as a sub-pixel in a display. In some embodiments, some components 30 can be one type of device, for example a light emitter made with a crystalline compound semiconductor, and other components can be another type of device, for example a control circuit made in mono-crystalline silicon.

Figure 3:
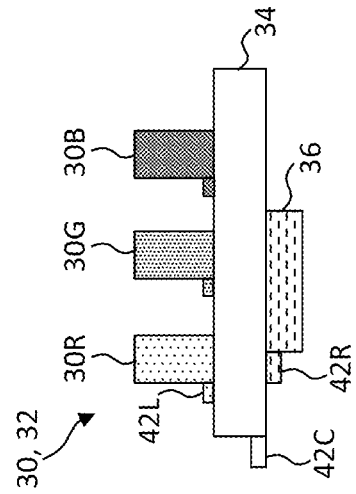
FIGS. 2 and 3 are cross sections of components according to some illustrative embodiments of the present disclosure.
Figure 2:
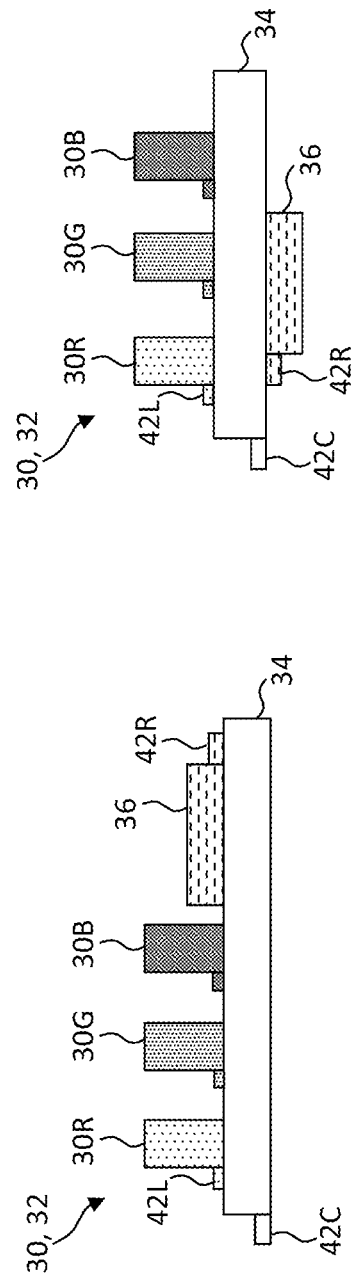

Referring also to the embodiments illustrated in the cross sections of FIGS. 2 and 3, each component 30 can be an active electro-optical device such as a pixel 32 in a display. In some embodiments, component 30 is a pixel 32 comprising multiple light emitters and a pixel controller 36. Pixel controller 36 can be an integrated circuit made in an inorganic crystalline silicon semiconductor, such as a complementary metal oxide semiconductor (CMOS), and provided in a native silicon source wafer. The light emitters can be light-emitting diodes (LEDs) or micro-light-emitting diodes (micro-LEDs, e.g., a red-light-emitting red micro-LED 30R, a green-light-emitting green micro-LED 30G, and a blue-light-emitting blue micro-LED 30B) and can be made in an inorganic crystalline compound semiconductor and provided in native LED source wafers from which they are transferred to display substrate 10, for example as shown in FIGS. 1 and 4.

In some embodiments, each component 30 can comprise a separate and independent component substrate 34 on which are disposed other devices, such as red-light-emitting red micro-LEDs 30R, green-light-emitting green micro-LEDs 30G, blue-light-emitting blue micro-LEDs 30B, and a pixel controller 36. In some embodiments, component 30 comprises multiple light emitters disposed on a common component substrate 34. Component 30 can be pixel 32 and controller 36 can be a pixel controller, for example a control circuit formed in a monocrystalline silicon integrated circuit disposed on common component substrate 34. Devices of component 30 can all be provided on a common side of component substrate 34, for example as shown in FIG. 2, or can be provided with some devices on opposite sides of component substrate 34, for example as shown in FIG. 3. Devices of component 30 can be unpackaged die provided on corresponding source wafers and transferred from the source wafers to a component wafer comprising component substrates 34 and can therefore comprise fractured tethers, as can component 30 (e.g., fractured component, LED, and controller tethers 42C, 42L, 42R).

Each entire component 30 on the component wafer can be transferred, for example by micro-transfer printing, to display substrate 10 and electrically connected, for example using photolithographic processes. A process of micro-transfer printing can comprise etching a cavity under each structure on the structure source wafer, leaving the structure attached to at least one anchor portion of the source wafer with at least one tether, contacting each structure with a stamp post 62 on stamp body 64 of a stamp 60 to adhere the contacted structure to the corresponding post, removing stamp 60 and the adhered structure, fracturing the tether(s), and then contacting the structure to a target substrate, such as a component source wafer or display substrate 10, e.g., as shown in FIG. 13B discussed below.

As shown in FIGS. 2 and 3 (but omitted elsewhere for clarity), each micro-LED is micro-transfer printed to component substrate 34 from a native micro-LED source wafer and has a broken (e.g., fractured or separated) LED tether 42L (e.g., that extends from component substrate 34). Controller 36 is likewise micro-transfer printed to component substrate 34 from a native controller source wafer and has a fractured controller tether 42R. The entire component 30 has a component tether 42C as it is micro-transfer printed to display substrate 10 from a component source wafer. FIG. 4 illustrates the assembled component 30 corresponding to FIG. 2 and FIG. 5 illustrates the assembled component 30 corresponding to FIG. 3 (omitting the tethers for clarity).

Figure 6:
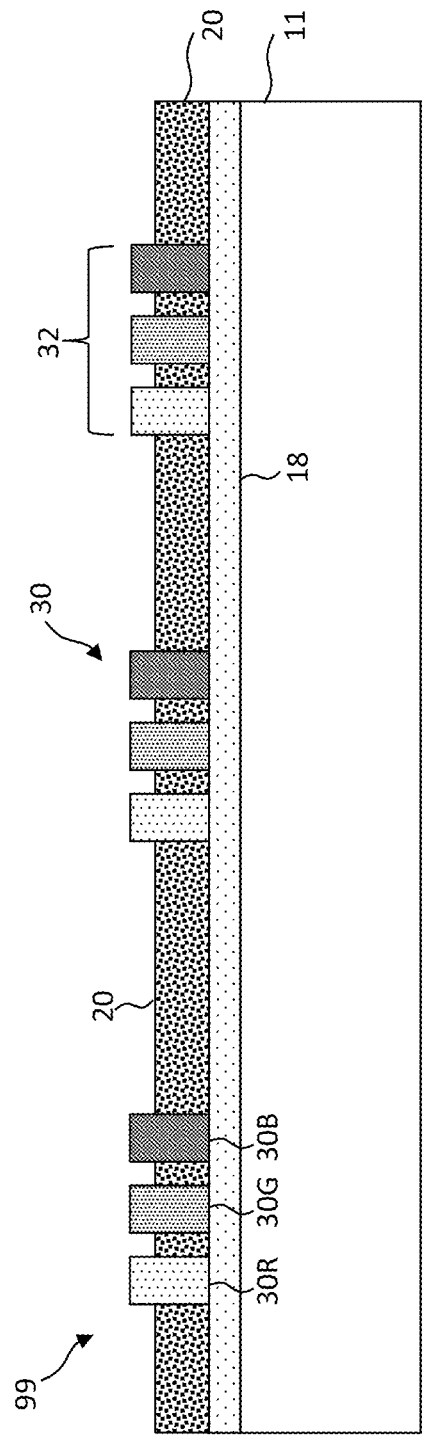

Referring to FIG. 6, in some embodiments of the present disclosure, display substrate 10 of display structure 99 comprises a support 11 and an adhesive layer 18 having an adhesive layer surface disposed on support 11 that adheres components 30 to support 11. The adhesive layer surface can be display surface 12. In some embodiments, an adhesive layer 18 is disposed on display substrate 10. Suitable adhesive layers 18 can comprise polymers, resins, or epoxies and can be curable, for example with light such as ultraviolet or infrared light or with heat. Adhesive layer 18 can be an optically clear adhesive (OCA). Adhesive layers 18 can be provided on support 11 or display substrate 10 by lamination or by coating, for example with spin, spray, hopper, slide, or slot coating. Adhesive layer 18 can adhere component 30 to support 11 during transfer, for example micro-transfer printing components 30 from a component source wafer to a target display substrate 10 or support 11, and then cured to substantially permanently adhere components 30 to display substrate 10 or support 11.

Thus, according to embodiments of the present disclosure, a display structure 99 comprises a display substrate 10 having a display surface 12, one or more light emitters 30 disposed on and in contact with display surface 12, an optically clear electrical insulator 88 disposed over the one or more light emitters 30, and a uniformly coated layer 20 of light-absorbing material, wherein the one or more light emitters 30, optically clear electrical insulator 88, or both the one or more light emitters 30 and optically clear electrical insulator 88 protrude through uniformly coated layer 20 of light-absorbing material. In some embodiments, display substrate 10 comprises an adhesive layer 18 and a surface of adhesive layer 18 is display surface 12. Optically clear electrical insulator 88 can be disposed in a patterned layer or in an unpatterned layer.

Electrical connections can be formed to electrically connect components 30 to any electrical components or structures disposed on display substrate 10 or support 11 using photolithographic methods and materials. Layer 20 of light-absorbing material can then be disposed over adhesive layer 18 as discussed further below. As shown in the embodiments illustrated in FIG. 7, components 30 comprise one or more connection posts 38, for example disposed on a side of component substrate 34 adjacent to display substrate 10. Connection posts 38 can be electrically connected to any circuits or structures provided in component 30. Display substrate 10 can comprise electrical contact pads 14 and wires 16 that are electrically connected to contact pads 14 and to any other circuits disposed on display substrate 10 or to external circuits used in conjunction with display structure 99, such as an external display controller. Connection posts 38 extend through at least a portion of layer 20 of light-absorbing material, for example by printing (e.g., micro-transfer printing) components 30 onto layer 20 of light-absorbing material before layer 20 of light-absorbing material is cured so that connection posts 38 are in electrical contact with contact pads 14 or any other suitable electrical conductor disposed on or comprised in display substrate 10 to electrically connect components 30 to contact pads 14, wires, 16 or any other electrical circuits disposed on, comprising, or external to display substrate 10. Light-absorbing material can be an adhesive material, for example forming adhesive layer 18, and adhere components 30 to display substrate 10 or support 11.

Figure 8A:
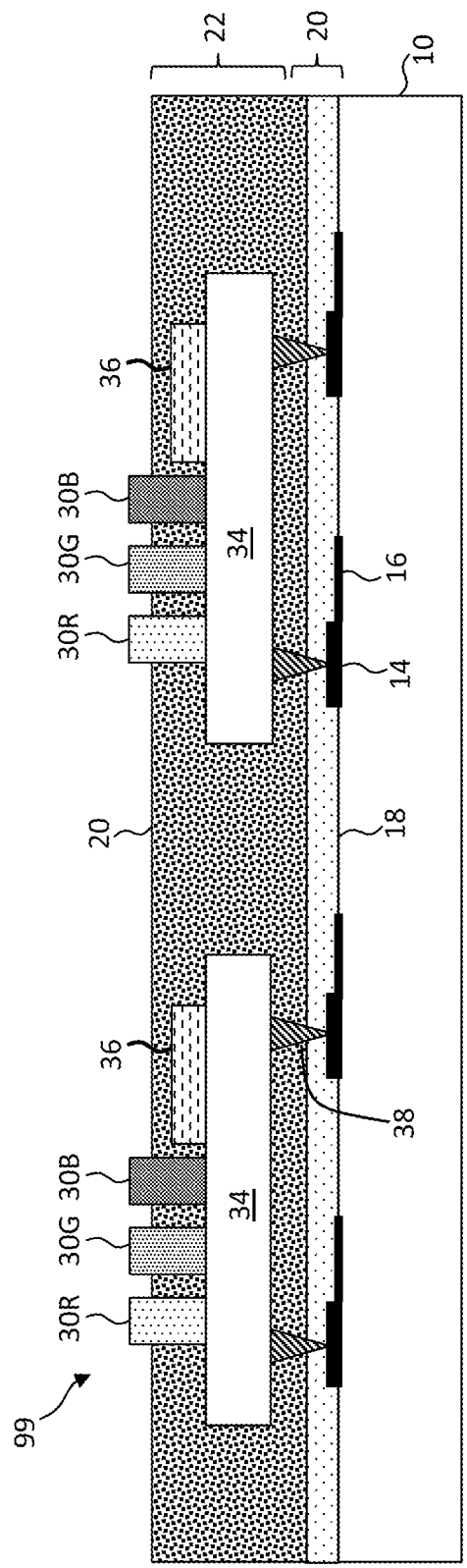
FIGS. 8A and 8B are cross section of displays structure comprising components having connection posts and a layer of light-absorbing material according to some illustrative embodiments of the present disclosure.

As shown in the embodiments illustrated in FIG. 8A, components 30 comprising connection posts 38 are printed (e.g., micro-transfer printed) onto and through adhesive layer 18 to electrically connect components 30 to contact pads 14 and wires 16. Layer 20 of light-absorbing material can then be disposed over adhesive layer 18. In some embodiments, adhesive layer 18 and layer 20 of light-absorbing material can be cured separately or together. In some embodiments, one of adhesive layer 18 and layer 20 of light-absorbing material is curable and the other is not.

Figure 7:
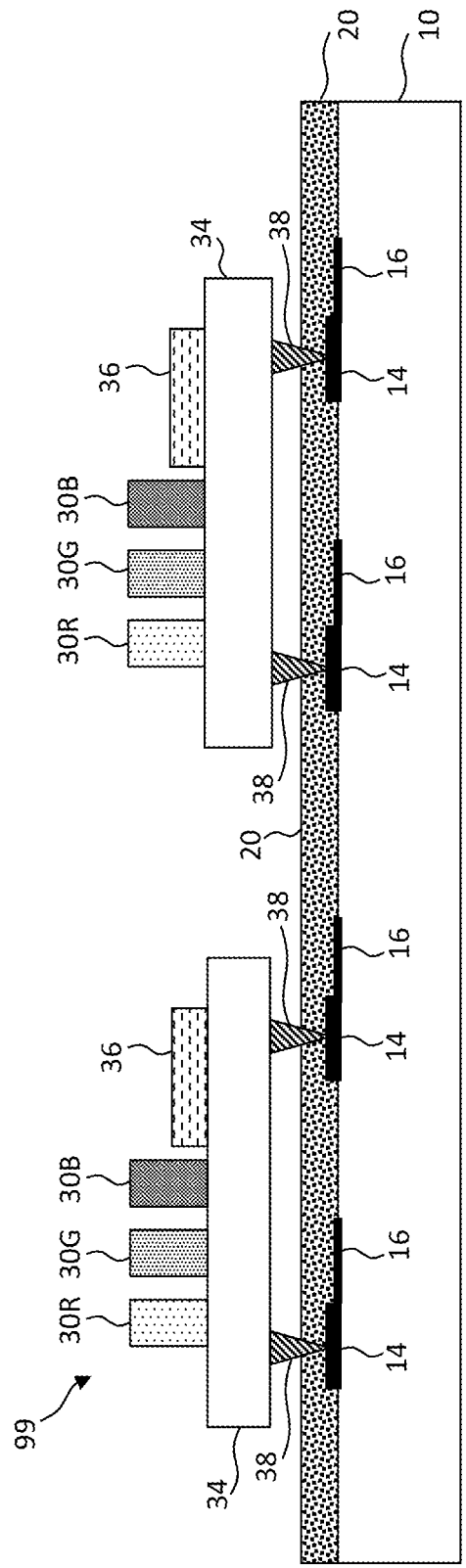
FIG. 7 is a cross section of a display structure comprising components having connection posts according to some illustrative embodiments of the present disclosure.
Figure 8B:
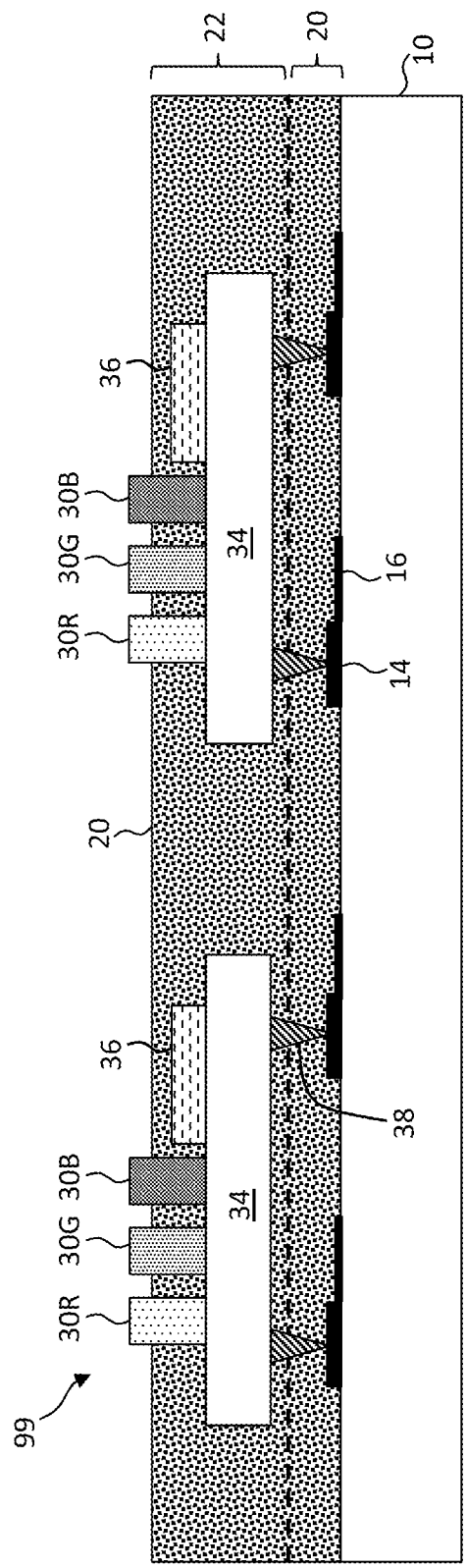

In some embodiments, the structure illustrated in FIG. 7 can be further processed by depositing a second layer 22 of light-absorbing material on first layer 20, providing a thick layer 20 of light-absorbing material, for example as shown in FIG. 8B. Second layer 22 of light-absorbing material can be processed in the same way as layer 20 of light-absorbing material illustrated in FIG. 1, by coating second layer 22 of light-absorbing material over at least a portion of each component 30 and then doing an unpatterned etch of second layer 22 of light-absorbing material to expose at least a portion of each component 30. Such an additional layer of light-absorbing material can further absorb ambient light and further adhere components 30 to display substrate 10.

Figure 9A:
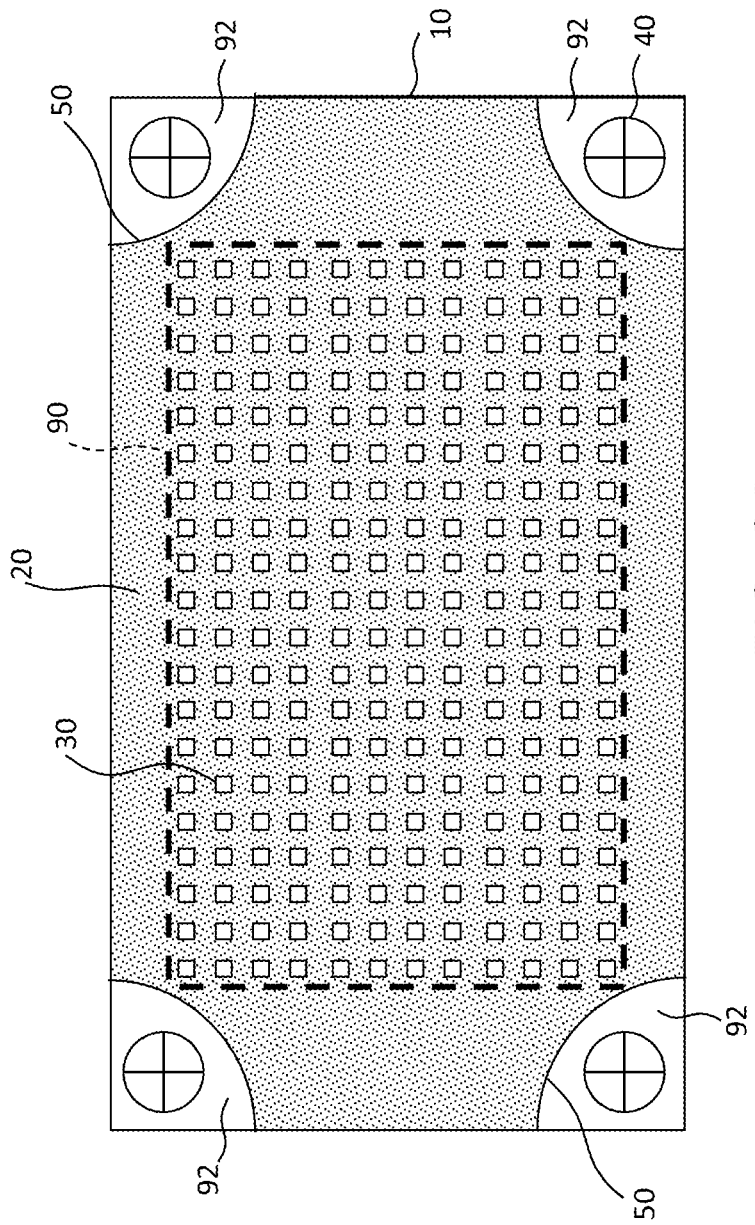
Figure 9B:
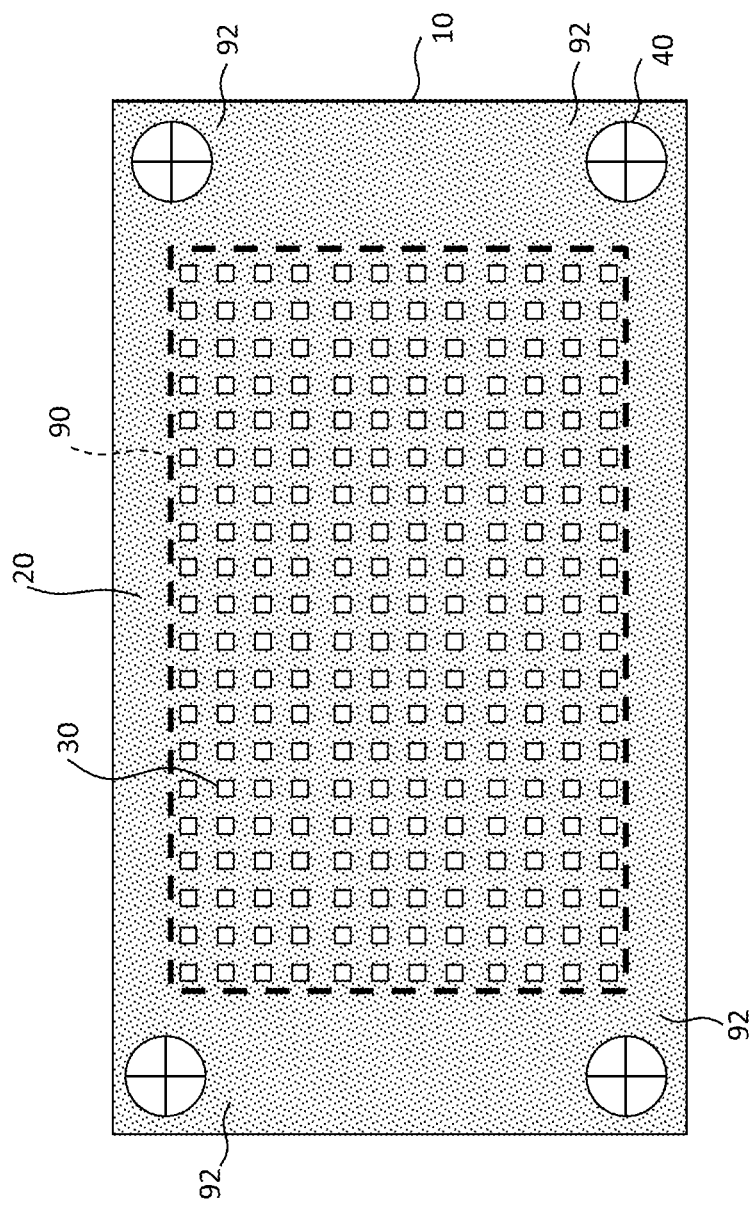
Figure 20:
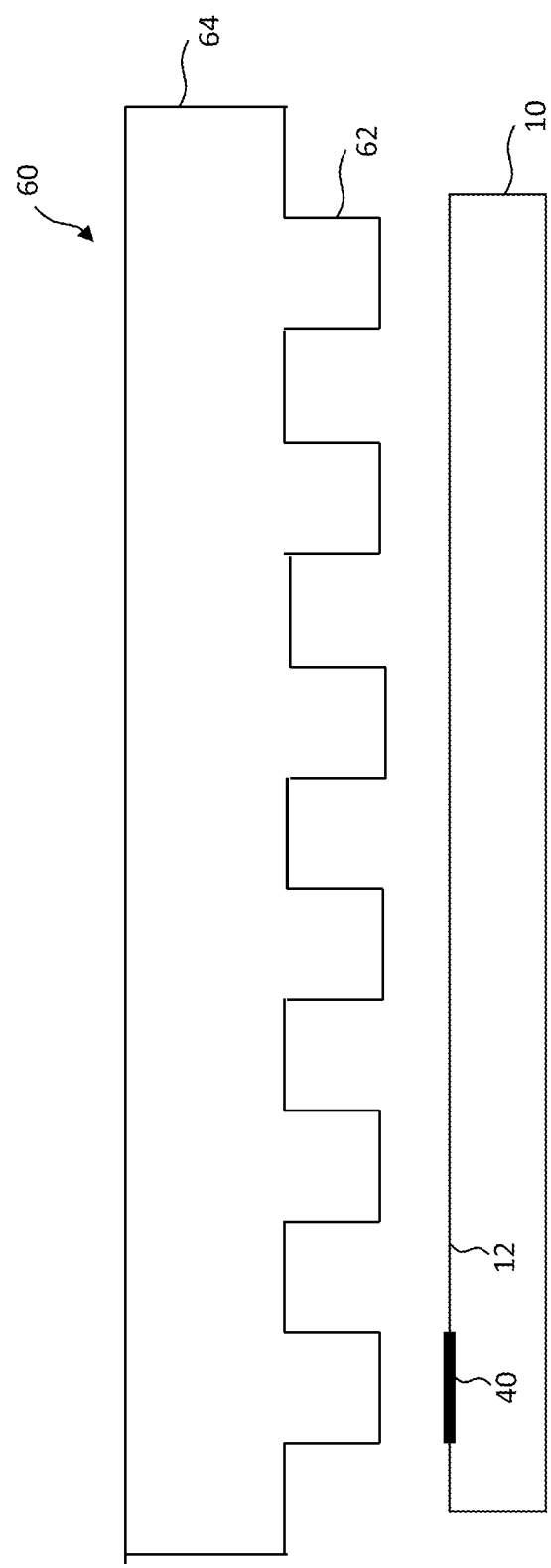
FIG. 20 is an illustration of a stamp aligned with a registration mark according to illustrative embodiments of the present disclosure.

Referring to FIG. 9A, in some embodiments of the disclosure, display substrate 10 comprises a display area 90 including all of components 30 and a registration area 92 separate from display area 90. Layer 20 of light-absorbing material is disposed in display area 90 and registration area 92 comprises a registration mark 40 (e.g., a fiducial mark used as a point of reference) disposed on or over display substrate 10. Optionally, layer 20 of light-absorbing material is absent from registration area 92 to enable improved optical detection of registration mark 40 so that display substrate 10 can be aligned with a micro-transfer printing device and components 30 can be disposed in alignment with or registered to display substrate 10, e.g., as shown in FIG. 20 where a stamp 60 is optically aligned with a registration mark 40 on display surface 12 of display substrate 10 through stamp post 62. A barrier 50 can be disposed on display substrate 10 that separates display area 90 from registration area 92 and can be used to keep layer 20 of light-absorbing material from registration area 92, for example when spin coating an uncured liquid layer of light-absorbing material. In some embodiments and as shown in FIG. 9B, registration marks 40 protrude (e.g., project stick out, or extend) through layer 20 of light-absorbing material so that they can be optically detected, even in the presence of layer 20 of light-absorbing material. In some embodiments, a corresponding barrier 50 physically separates each of the one or more registration areas 92 from the display area 90 and uniformly blanket coating the curable layer 21 of uncured light-absorbing material comprises physically contacting the uncured light-absorbing material against the corresponding barrier 50.

As shown in FIGS. 9A and 9B, registration marks 40 can be used to register or align display substrate 10 to components 30 when transferring components 30 from a component source wafer to display substrate 10. In some embodiments of the present disclosure, referring to FIG. 9C, display substrate 10 comprises a pin registration structure 44 (for example a pin or pinhole). Pin registration structure 44 can be used to mechanically align display substrate 10 to a stamp 60 (e.g., stamp 60 as shown in FIG. 11D) or other transfer device so that components 30 can be disposed in alignment with and mechanically registered to display substrate 10. Similarly, referring to FIG. 9D, display substrate 10 comprises a registered edge specifying an edge distance 46 from a registration mark 40 to an edge of display substrate 10 in one or two dimensions, such as an x edge distance 46 and a y edge distance 46 over display substrate 10. Edge distance 46 can be measured before layer 20 of light-absorbing material is deposited and possibly optically obscures registration mark 40. Edge distance 46 can then be used in conjunction with a transfer device (such as a micro-transfer printing tool, that includes a stamp and motion platform system) to register or align components 30 on display substrate 10.

Thus, according to some embodiments of the present disclosure, a display structure 99 comprises a display substrate 10 having a display surface 12 and one or more registration areas 92, wherein each of the one or more registration areas 92 comprises a registration mark 40 or a pin registration structure 44, or both. Components 30 are disposed on and in contact with display surface 12 and a layer 20 of light-absorbing material having a uniform thickness is disposed on display surface 12, wherein layer 20 of light-absorbing material is in contact with components 30 and each component 30 protrudes from layer 20 of light-absorbing material.

According to some embodiments, display structure 99 comprises a corresponding barrier 50 for each of the one or more registration areas 92, wherein layer 20 of light-absorbing material is in contact with barrier 50 and is not in contact with at least a portion of registration area 92. Layer 20 of light-absorbing material can be in contact with registration mark 40 or pin registration structure 44. Components 30 can be pixels 32 each comprising one or more light emitters 30 and the one or more light emitters 30 can protrude from layer 20 of light-absorbing material. Pixels 32 can each comprise a component substrate 34 and layer 20 of light-absorbing material can be in contact with or cover component substrate 34. Pixels 32 can each comprise a controller 36 and layer 20 of light-absorbing material can be in contact with or cover controller 36.

Figure 10:
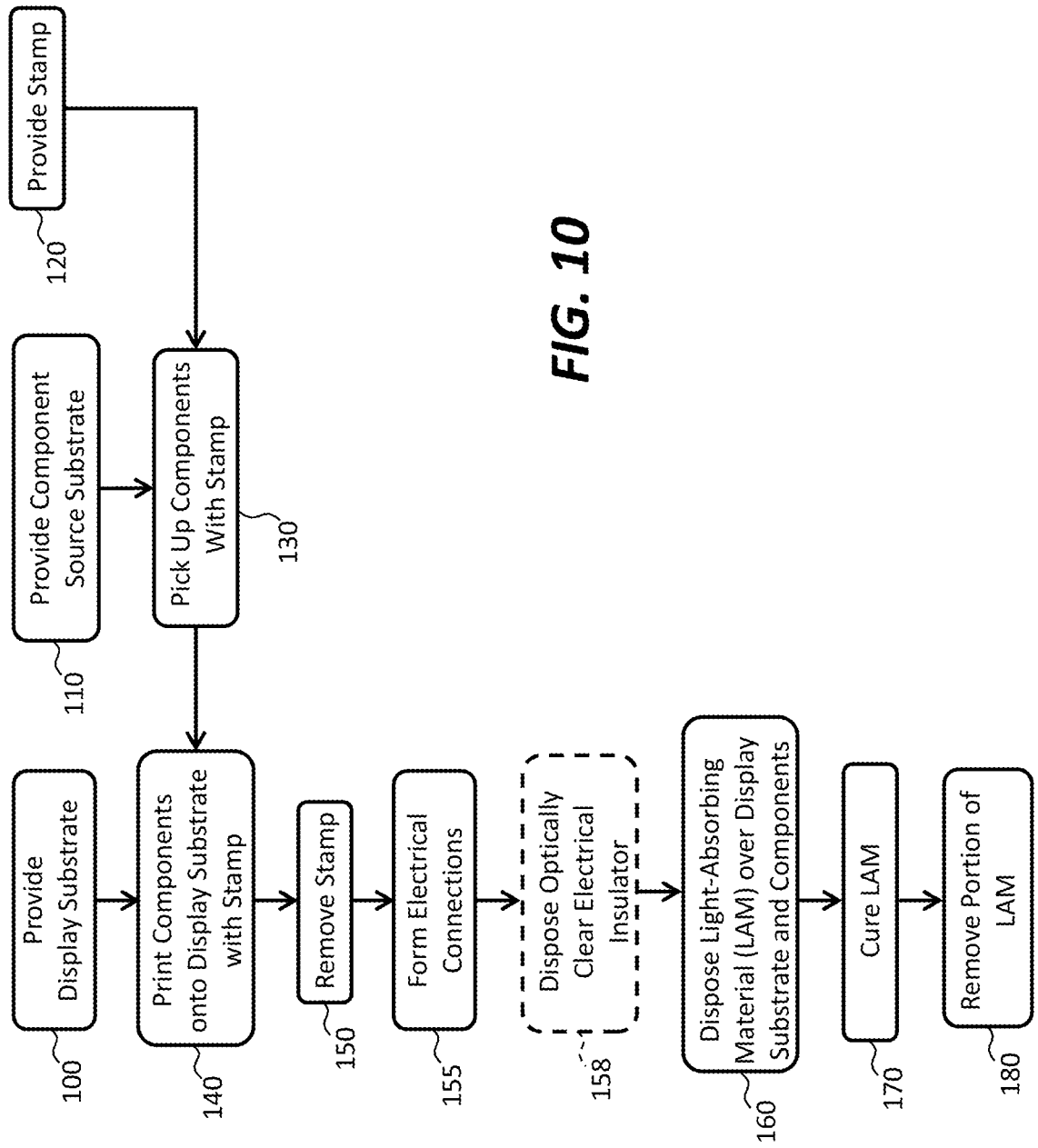
FIG. 10 is a flow diagram illustrating a construction method according to some illustrative embodiments of the present disclosure.

According to illustrative embodiments of the present disclosure and as illustrated in FIG. 10, a method of making a display structure comprises providing a display substrate 10 having a display surface 12 in step 100 and disposing components 30 on and in contact with display surface 12 in step 140. Display surface 12 is uniformly blanket coated with a curable layer 21 of uncured light-absorbing material in step 160 and, in step 170, curable layer 21 of uncured light-absorbing material is cured without pattern-wise etching layer 20 of light-absorbing material to provide a layer 20 of cured light-absorbing material so that each of components 30 protrude (e.g., project or extend) from layer 20 of cured light-absorbing material. A uniform blanket coating is a coating with a substantially planar surface that covers substantially all of a desired display area 90 (e.g., a display surface 12 including pixels 32 in the display) without patterning the coating in display area 90. In some embodiments of the present disclosure, each of components 30 protrude from layer 20 of cured light-absorbing material without having pattern-wise etched layer 20 of cured light-absorbing material after the light-absorbing material has been cured. In some embodiments, the uniform blanket coating of uncured light-absorbing material (e.g., layer 21) has a thickness greater than a thickness of each of components 30. In embodiments, disposing components 30 comprises printing each of components 30 completely through the curable layer 21 of uncured light-absorbing material (e.g., the uniform blanket coating) such that at least a portion of each of components 30 protrude from the curable layer 21 of uncured light-absorbing material. In some embodiments, each component 30 is coated with a de-wetting material.

Display substrate 10 can comprise a support 11 and an adhesive layer 18 disposed on support 11. Some embodiments of the present disclosure comprise micro-transfer printing components 30 onto display substrate 10, display surface 12, or adhesive layer 18. In some embodiments, at least a portion of each component 30 protrudes through adhesive layer 18 and contacts support 11, for example electrical contact structures such as contact pads 14 or wires 16 provided on or in support 11, display substrate 10, or display surface 12. In some embodiments, methods of the present disclosure comprise electrically connecting components 30 to contact pads 14 (e.g., as in step 155). In some embodiments, the step of uniformly blanket coating the light-absorbing material comprises coating a curable layer 21 of uncured light-absorbing liquid material that is subsequently cured (step 170). The light-absorbing liquid material can be a polymer, a resin, or an epoxy and can comprise cross-linking agents that are cured, for example through radiation or heat.

Figure 11H:
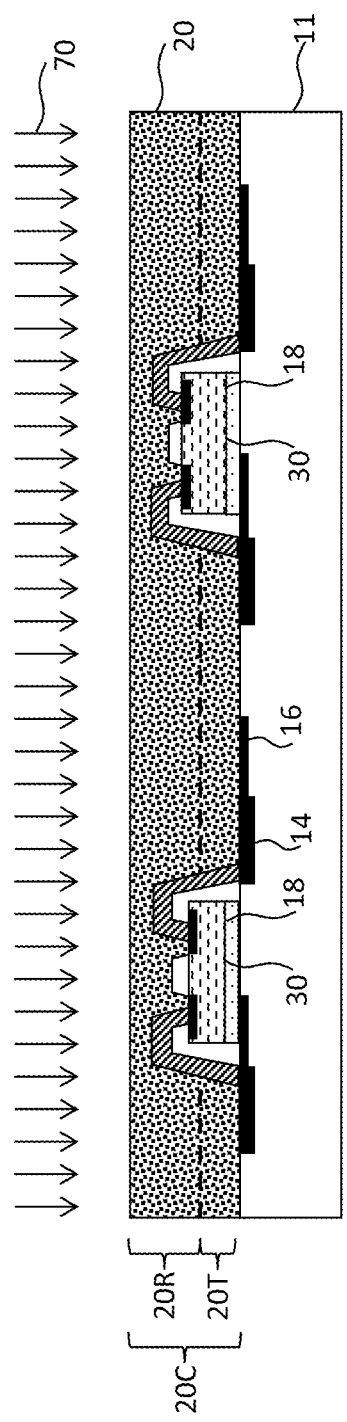

Referring again in more detail to the flow diagram of FIG. 10 and the sequential structures illustrated in FIGS. 11A-11I, some methods of the present disclosure can include providing a display substrate 10 that optionally includes support 11 with a display surface 12 in step 100 and as shown in FIG. 11A. Electrical structures such as electrical contact pads 14 and wires 16 forming an electrical connection circuit can be formed on display surface 12 of display substrate 10 (e.g., of support 11), for example as shown in FIG. 11B. A layer of adhesive 18 is optionally disposed over support 11 as shown in FIG. 11C and display surface 12 can then be the surface of adhesive layer 18. Adhesive layer 18 and support 11 can form display substrate 10 or display substrate 10 can be a support 11 without adhesive layer 18. In step 110, components 30 are provided on a component source wafer, for example by photolithographic processing and optionally by micro-transfer printing (e.g., as shown in FIGS. 2 and 3). A stamp 60 is provided, for example as a part of a micro-transfer printing tool and process, in step 120. In step 130, components 30 are picked up with stamp 60 from the component source wafer and disposed on display surface 12 in step 140 (as shown in FIG. 11D). (For clarity, component tethers 42C, shown in FIGS. 2 and 3, are not shown in FIGS. 11D-11I but can be present on or as part of each component 30.) Stamp 60 is removed in step 150 and components 30 protrude (e.g., project, stick out, or extend) from display surface 12 a component thickness 30T, as shown in FIG. 11E. In some embodiments, adhesive layer 18 materials between components 30 can be removed (e.g., by etching, such as by exposure to chemicals or energetic particles) and electrical connections can be formed between components 30 and any electrical structures on display substrate 10 in step 155, for example using photolithographic methods and materials, as shown in FIG. 11F with contact pads 14, wires 16, patterned dielectric structures 82, and electrodes 84.

Figure 19:
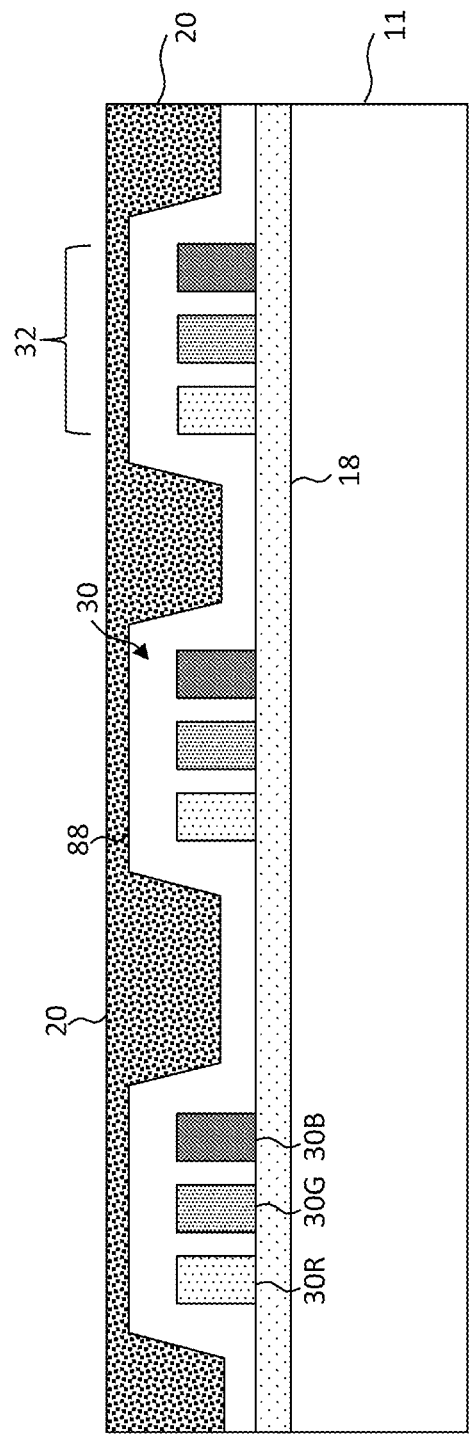
FIG. 19 is a cross section of a display structure according to illustrative embodiments of the present disclosure.

According to some embodiments, optional step 158 comprises optionally coating components 30 with an optically clear electrical insulator 88 for example disposed in a conformal layer over at least a portion of each component 30 and optionally over portions of display surface 12 between components 30. Optically clear electrical insulator 88 can be patterned so that it is disposed only over at least a portion of each component 30 (or disposed in a local area around components 30), for example as shown in FIG. 18A, or unpatterned, as shown in FIG. 18B. Deposition and patterning can be performed using conventional photolithographic means and materials, for example spray coating, sputtering, or chemical vapor deposition, and the use of photo resist, masks, and etchants. Suitable optically clear electrical insulator 88 materials can comprise an organic polymer such as polyimide, resin, or epoxy or an inorganic material such as silicon dioxide or silicon nitride. Optically clear electrical insulator 88 can encapsulate components 30 to protect them from environmental contaminants or to protect them from light-absorbing material. As shown in FIG. 19 (corresponding to FIG. 11G and step 160 of FIG. 10 discussed below), layer 20 of light-absorbing material is disposed over optically clear electrical insulator 88. In some embodiments, layer 20 of light-absorbing material can be somewhat electrically conductive, for example if it comprises carbon black, and the electrical conductivity can create electrical shorts, for example high-resistance electrical shorts, on components 30 or conductors electrically connected to components 30. Optically clear electrical insulator 88 can protect components 30 or, more generally display structure 99, from such electrical shorts.

As shown in FIG. 11G and FIG. 19, in step 160 display surface 12 and components 30 are uniformly blanket coated with a curable layer 21 of uncured light-absorbing material (e.g., a black matrix) to a coating thickness 20C greater than component thickness 30T so that the surface of each component 30 is covered with curable layer 21 of uncured light-absorbing material and uncured layered 21 of light-absorbing material is disposed over at least a portion of each component 30. Curable layer 21 of uncured light-absorbing material can be coated as a liquid, for example a curable liquid. As used herein, a uniform blanket coating is an unpatterned coating with a substantially planar surface that extends over at least display area 90 of display substrate 10 and components 30. Coating can be accomplished, for example, by spin coating, spray coating, hopper coating, slot coating, or slide coating, or doctor blading. However, spin coating a curable layer 21 of uncured light-absorbing material that does not extend over the top of components 30 tends to result in a variable-thickness coating (e.g., a non-uniform coating) within display area 90 because pre-disposed components 30 can interrupt the spread of the spin-coated material and portions of the coating adjacent to a side of component 30 closer to an edge of display substrate 10 will be thinner than a side of component 30 opposite the edge with respect to the rotational center of the spin, thereby forming a layer that is not uniform and not substantially planar. Therefore, according to some embodiments of the present disclosure, spin coating curable light-absorbing material only provides a uniform blanket coating if layer 20 of light-absorbing material (in this case curable layer 21 of uncured light-absorbing material) coating thickness 20C is greater than component thickness 30T. If layer 20 of light-absorbing material is not substantially uniform, the absorption of ambient light by layer 20 of light-absorbing material will not be uniform, which can result in a non-uniform appearance of display structure 99. Similarly, spray, hopper, slot, or slide coating tend not to provide a uniform blanket coating unless curable layer 21 of light-absorbing material coating thickness 20C is greater than component thickness 30T. If a thinner layer 20 of light-absorbing material coating is provided, it will likely not be uniform since layer 20 of light-absorbing material will be disposed over components 30 and on display substrate 10 between components 30 and therefore does not have a substantially planar surface. Thus, as with a spin coating, spray, hopper, slot, or slide coating a layer 20 of light-absorbing material with a thickness less than component thickness 30T will likely not result in a uniform or substantially planar coating. Thus, according to some embodiments of the present disclosure, a uniformly blanket coating that is substantially planar and unpatterned over a display substrate 10 and components 30 must have a thickness greater than component thickness 30T.

In step 170, uncured light-absorbing material can be cured, for example by heat or electromagnetic radiation or both. According to some embodiments of the present disclosure, in step 170 uncured light-absorbing material is only partially cured, for example sufficiently cured to enable the following unpatterned etching step 180. A final hard cure can be performed after display structure 99 is assembled or completed. In some embodiments, step 170 is a hard cure and no other layer 20 of light-absorbing material cures are necessary.

Figure 11I:
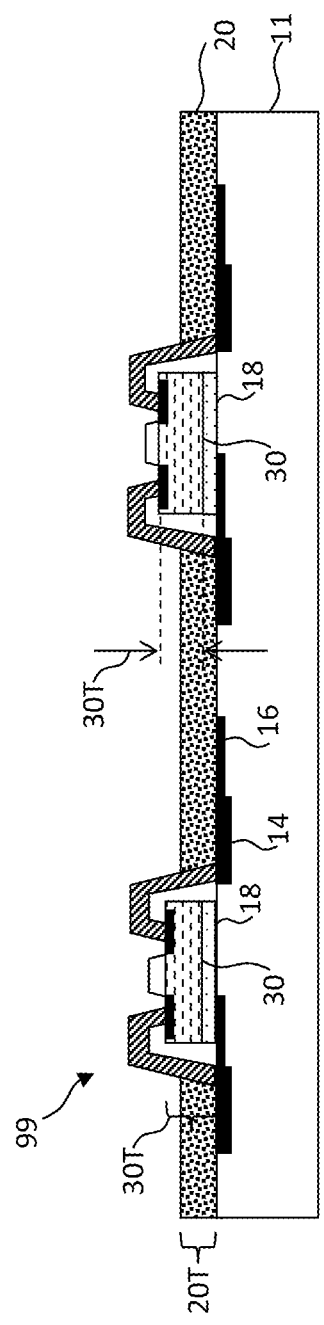

In step 180 and as illustrated in FIG. 11H, a top portion 20R of layer 20 of light-absorbing material is removed with an unpatterned etch leaving a remaining portion 20T of layer 20 of light-absorbing material, so that remaining portion 20T of light-absorbing material has a layer thickness greater than zero and less than component thickness 30T and at least a portion of each component 30 protrudes (e.g., projects or extends) from layer 20 of light-absorbing material, as shown in FIG. 11I. A top portion 20R of layer 20 of light-absorbing material is a portion, layer portion, or sub-layer of layer 20 that is opposite display substrate 10 and is not in contact with display surface 12 (e.g., not in contact with adhesive layer 18). Remaining portion 20T can likewise be a portion, layer portion, or sub-layer of layer 20. Components 30 that at least partially protrude from layer 20 of light-absorbing material can emit or receive light without light absorption or occlusion by layer 20 of light-absorbing material.

Thus, according to some embodiments of the present disclosure and as illustrated in FIG. 10 and FIGS. 11A-11I, a method of making a display structure 99 comprises providing a display substrate 10 having a display surface 12 in step 100, disposing components 30 on and in contact with display surface 12 so that at least a portion of each component 30 protrudes from display surface 12 a component thickness 30T in step 140, uniformly blanket coating display surface 12 with a curable layer 21 of uncured light-absorbing material to a coating thickness 20C greater than component thickness 30T in step 160, curing curable layer 21 of uncured light-absorbing material to form a layer 20 of cured light-absorbing material in step 170, removing a top portion 20R of layer 20 of cured light-absorbing material with an unpatterned etch leaving a remaining portion 20T of layer 20 of cured light-absorbing material in step 180, so that remaining portion 20T has a layer thickness greater than zero and less than component thickness 30T and at least a portion of each component 30 protrudes from layer 20 of light-absorbing material.

Figure 12:
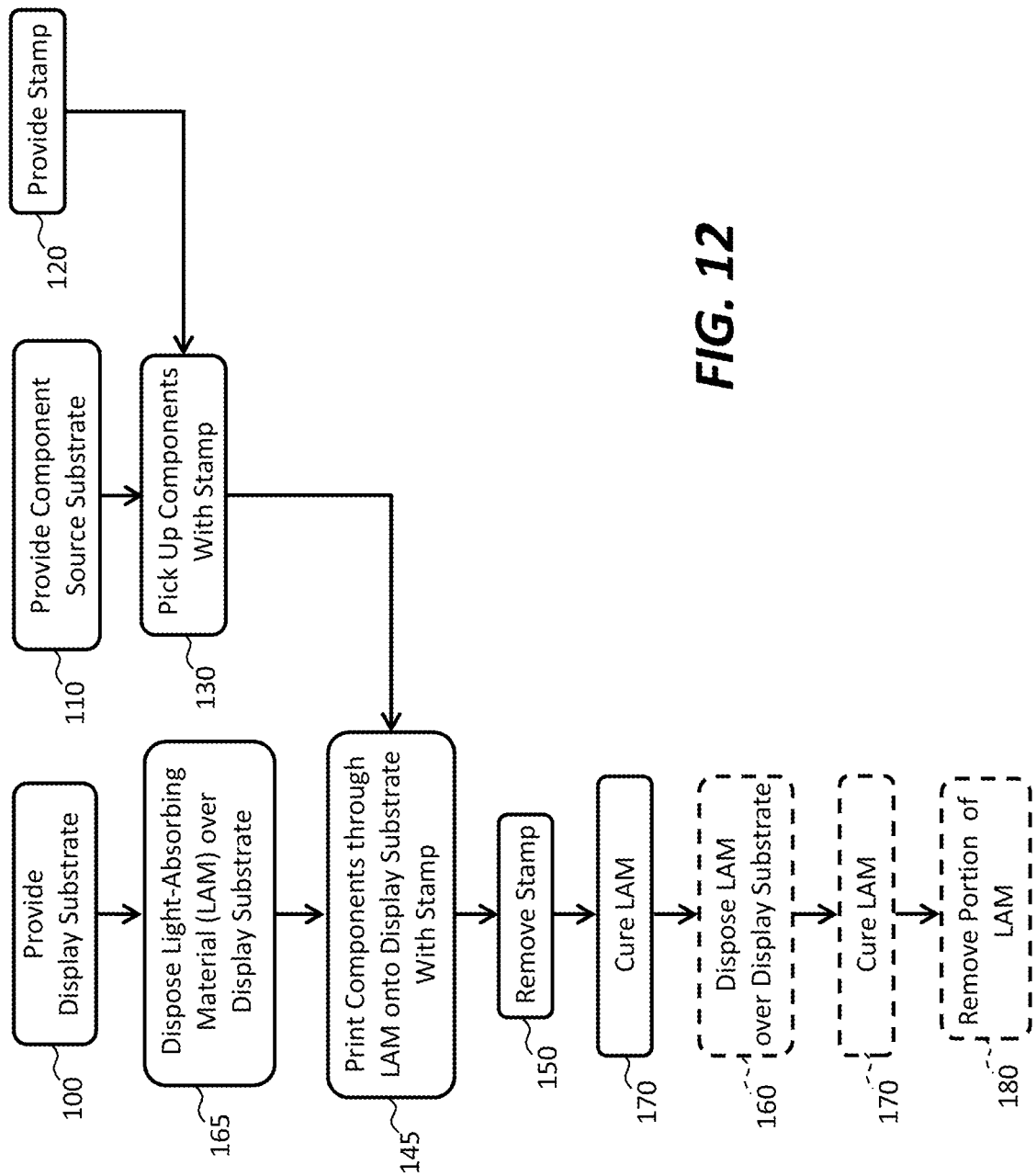
FIG. 12 is a flow diagram illustrating a construction method according to some illustrative embodiments of the present disclosure.

Referring to the flow diagram of FIG. 12 and the sequential structures illustrated in FIGS. 11A-11B and FIGS. 13A-13E, methods of the present disclosure can include providing a display substrate 10) with a display surface 12 in step 100 and as shown in FIG. 11A. Electrical structures such as electrical contact pads 14 and wires 16 forming an electrical connection circuit can be formed on display surface 12 of support 11 or display substrate 10, for example as shown in FIG. 11B. In step 110, components 30 are provided on a component source wafer, for example by photolithographic processing and optionally micro-transfer printing (e.g., as shown in FIGS. 2 and 3). A stamp 60 is provided, for example as a part of a micro-transfer printing tool and process, in step 120. A curable layer 21 of uncured light-absorbing material (e.g., black matrix) is uniformly blanket coated over support 11, display surface 12, or display substrate 10, in step 165 and as shown in FIG. 13A to a coating thickness 20C. In step 130, components 30 are picked up with stamp 60 from the component source wafer and transfer printed (e.g., micro-transfer printed) onto display surface 12 and through curable layer 21 of uncured light-absorbing material in step 145 (as shown in FIG. 13B) such that at least a portion of each component 30 protrudes (e.g., extends or projects) from curable layer 21 of uncured light-absorbing material. Curable layer 21 of uncured light-absorbing material can adhere components 30 to support 11 or display substrate 10 and assist in the transfer printing process. At least a portion of each components 30 has a component thickness 30T greater than coating thickness 20C, so that each component 30 protrudes (e.g., projects, sticks out, or extends) from curable layer 21 of uncured light-absorbing material, as shown in FIG. 13C. Display substrate 10 (or support 11) can comprise one or more contact pads 14 on or in display surface 12 and each component 30 can comprise one or more connection posts 38. According to some embodiments of the present disclosure, disposing (e.g., micro-transfer printing) components 30 comprises pressing the one or more connection posts 38 of each component 30 through curable layer 21 of uncured light-absorbing material onto or into each of one or more contact pads 14 to form an electrical contact between each of one or more connection posts 38 and each of one or more contact pads 14, and thus, for example, forms an electrical contact between the one or more contact pads 14 and any circuit(s) in components 30 connected to one or more connection posts 38.

Stamp 60 is removed in step 150 as shown in FIG. 13C, and curable layer 21 of uncured light-absorbing material is cured in step 170 to form a layer 20 of cured light-absorbing material, for example with heat 80 and as shown in FIG. 13D. The resulting structure is shown in FIG. 13E and is comparable to the structure illustrated in FIG. 7.

In some embodiments, components 30 comprise connection posts 38 and the step 165 of disposing (e.g., printing, such as micro-transfer printing) components through layer 20 of light-absorbing material and onto display substrate 10 forms electrical connections between components 30 and any electrical structures on support 11 or display substrates 10. Such a method precludes the need for further processing with photolithographic methods and materials to form the electrical connections shown in FIG. 11F with patterned dielectric structures 82 and electrodes 84, and therefore provides a more efficient assembly and electrical interconnection process for components 30 on display substrate 10 with fewer steps. Examples of connection posts useful herein are described in U.S. patent application Ser. No. 14/822,864, filed on Aug. 10, 2015, and U.S. Pat. No. 10,262,966, issued on Apr. 16, 2019.

Thus, according to some embodiments of the present disclosure and as illustrated in FIG. 12 and FIGS. 11A-11B and FIGS. 13A-13E, a method of making a display structure 99 comprises providing a display substrate 10 having a display surface 12 in step 100, uniformly blanket coating display surface 12 with a curable layer 21 of uncured light-absorbing material to a coating thickness 20C in step 165, disposing (in this example micro-transfer printing) components 30 onto display substrate 10 and through curable layer 21 of uncured light-absorbing material with a micro-transfer printing device (in this example stamp 60), at least a portion of each component 30 having a component thickness 30T greater than coating thickness 20C, and curing curable layer 21 of uncured light-absorbing material to provide a layer 20 of cured light-absorbing material so that each component 30 protrudes from layer 20 of cured light-absorbing material without pattern-wise etching layer 20 of cured light-absorbing material. In some embodiments, components 30 are disposed (e.g., printed, such as micro-transfer printed) onto display substrate 10 so that components 30 extend through a cured layer 20 of light-absorbing material.

Figure 14C:
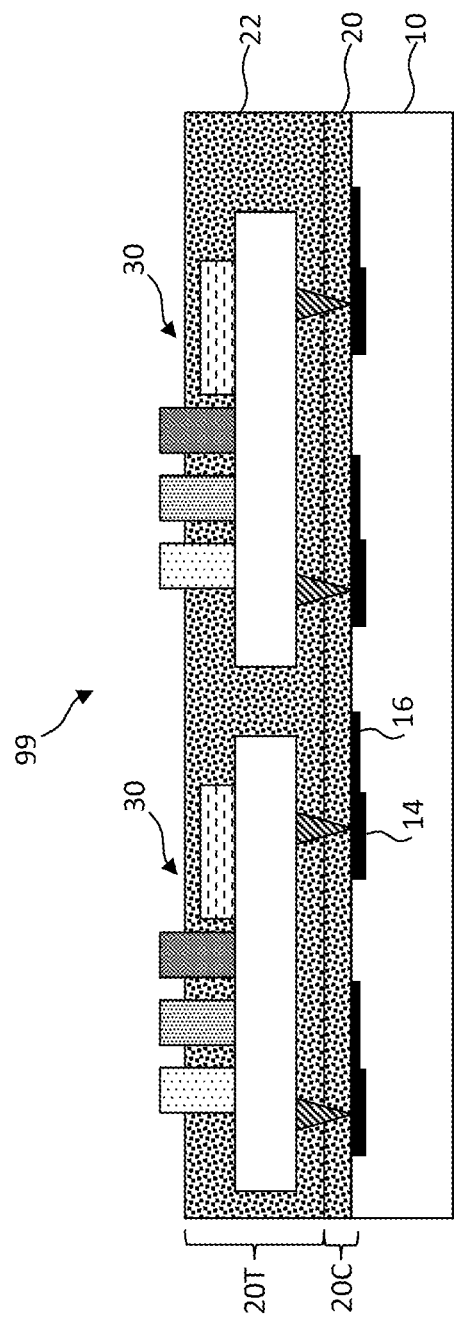

Referring again to the FIG. 12 flow diagram and the sequential structures of FIGS. 14A-14C, in some embodiments of the present disclosure, layer 20 of light-absorbing material is a first layer 20 and coating thickness 20C is a first coating thickness 20C. Methods of the present disclosure can comprise, in optional step 160 and as illustrated in FIG. 14A, uniformly blanket coating first layer 20 with a second curable layer 22 of uncured light-absorbing material to a second coating thickness 20S greater than a difference between component thickness 30T and first coating thickness 20C. Second curable layer 22 of uncured light-absorbing material can be disposed over at least a portion of each component 30. Second curable layer 22 can comprise or be the same material as first layer 20, or a different material. Second curable layer 22 is optionally cured in step 170. A top portion 20R of second layer 22 is optionally removed in step 180, for example by an unpatterned etch with an etchant 70 shown in FIG. 14B, leaving a remaining portion 20T of the light-absorbing material (e.g., a remaining layer), so that remaining portion 20T of light-absorbing material has a remaining layer thickness 20T greater than zero and less than a difference between component thickness 30T and first coating thickness 20C so that each component 30 protrudes (e.g., projects or extends) from second layer 22 of light-absorbing material, as shown in FIG. 14C. These steps are similar to those illustrated in FIG. 11G-11I. Etchant 70 can be generally anything that effectively removes top portion 20R, for example a chemical or energetic particles such as plasmas or other reactive ions. By providing an additional, thicker layer 22 of light-absorbing material as shown in FIG. 14C, ambient light can be more completely absorbed and reflections from display structure 99 reduced, thereby improving display contrast.

Thus, according to embodiments of the present disclosure, a display structure 99 comprises a display substrate 10 having a display surface 12, one or more contact pads 14 disposed in or on display surface 12, and pixels 32 disposed on display surface 12, Each pixel 32 comprises a component substrate 34, one or more light emitters 30, and one or more electrically conductive connection posts 38. A layer 20 of cured light-absorbing material is disposed on display substrate 10. Each of the one or more connection posts 38 extends through layer 20 of cured light-absorbing material and is in electrical and physical contact with one of the one or more contact pads 14 so that the one or more light emitters 30 protrude from layer 20 of cured light-absorbing material. Layer 20 of cured light-absorbing material can be in contact with or cover component substrate 34. Layer 20 of cured light-absorbing material can have a coating thickness greater than a combined thickness of the one or more connection posts 38 and component substrate 34. Pixels 32 can each comprise a controller 36. Layer 20 of cured light-absorbing material can be in contact with or cover controller 36.

One or more light emitters 30 can each have one or more of a height to width aspect ratio and a height to length aspect ratio of greater than 1. In some embodiments, only the one or more light emitters 30 protrude from layer 20 of cured light-absorbing material after curing.

Referring to FIG. 15, in some embodiments of the present disclosure, a printing (e.g., micro-transfer printing step) (e.g., steps 140, 145) comprise an alignment step 200 in which components 30 are aligned to display substrate 10 followed by a contacting step 210 in which components 30 are contacted to display substrate 10 to print (e.g., micro-transfer print) components 30 in alignment to display substrate 10.

Alignment step 200 can be accomplished in a variety of ways, for example as illustrated in FIGS. 9A-9D, using optical or mechanical alignment with optical sensors and a mechanical stage under the control of control circuits or computers and servomotors, for example digital stepper or linear motors. In some embodiments and as shown in FIG. 9A, display substrate 10 comprises a display area 90 and a separate registration area 92 separate from display area 90 and registration area 92 comprises a registration mark 40 disposed on or over display substrate 10, methods of the present disclosure can comprise disposing layer 20 of light-absorbing material in display area 90 and not in registration area 92. By not disposing layer 20 of light-absorbing material in registration area 92, registration mark 40 can be optically exposed and can be used to register display substrate 10 to a micro-transfer printing device (e.g., stamp 60). In some embodiments and with reference to FIG. 9B, methods of the present disclosure optically detect registration marks 40 that protrude (e.g., project or extend) through layer 20 of light-absorbing material.

Figure 9C:
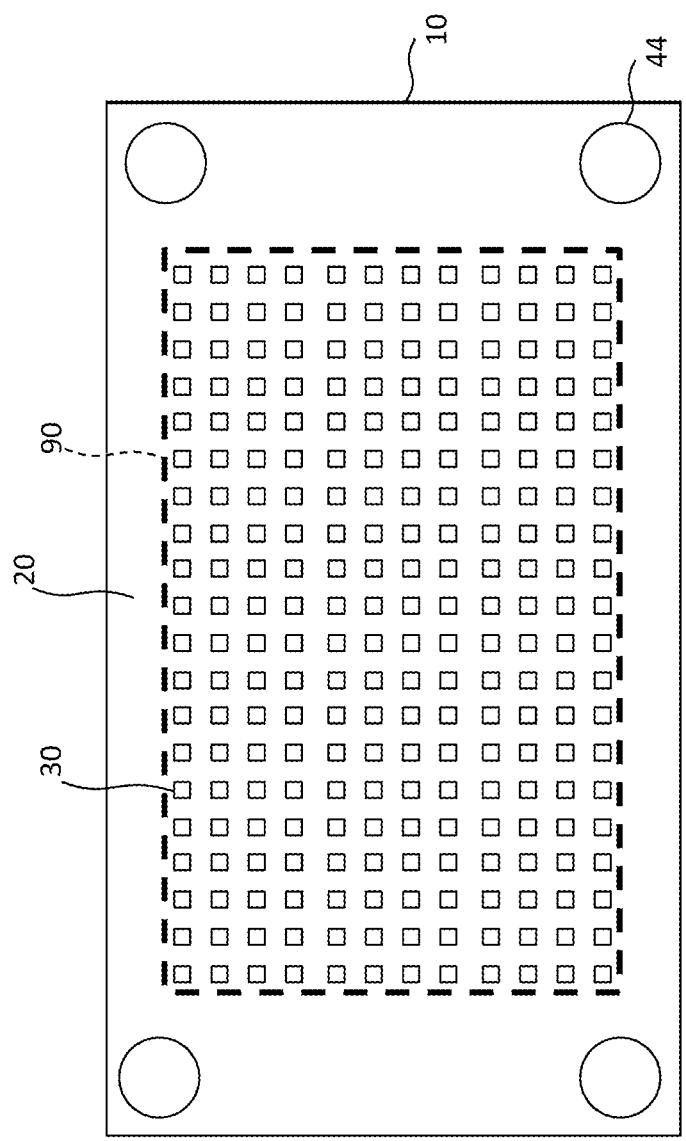

In some embodiments and as shown in FIG. 9C, display substrate 10 comprises a pin registration structure 44 and methods of the present disclosure can comprise registering display substrate 10 to a micro-transfer printing device (e.g., stamp 60) with pin registration structure 44 using mechanical means, such as a pin on the micro-transfer printing device and a pinhole (e.g., pin registration structure 44) in device substrate 10 (or vice versa). Therefore, pin registration structure 44 can be, for example, a hole or a pin. A hole or pin can be circular in cross section or have another cross section, such as a polygonal cross section.

In some embodiments and as shown in FIG. 9D, display substrate 10 comprises a registration mark 40 at a particular (e.g., documented or predetermined) distance from registration mark 40 to one or more edges of display substrate 10 (providing corresponding registered edge), so that if registration mark 40 is obscured by layer 20 of light-absorbing material, methods of the present disclosure can comprise registering display substrate 10 to a micro-transfer printing device (e.g., stamp 60) by the registered edge.

Figure 17A:
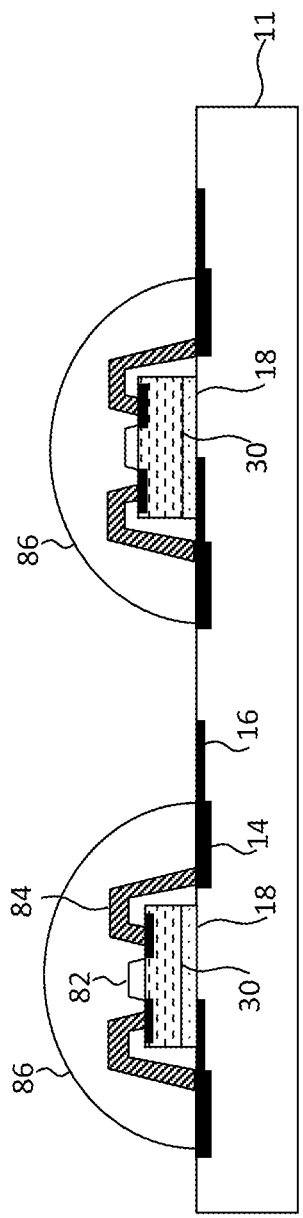
FIGS. 17A-17B are sequential steps illustrating structures according to some illustrative embodiments of the present disclosure.
Figure 17B:
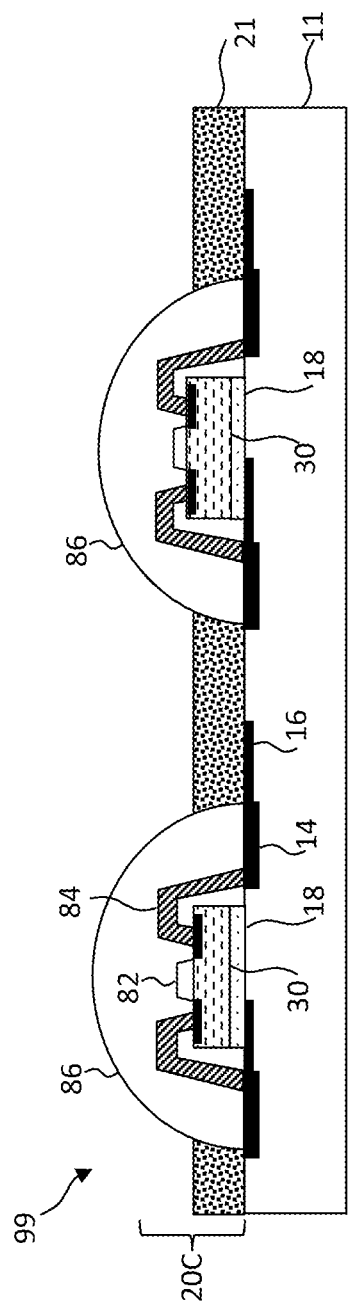

According to some embodiments and as illustrated in FIGS. 10, 11A-11F, 16, 17A, and 17B, methods of the present disclosure comprise disposing components 30 on display surface 12 so that components 30 protrude from display surface 12 a component thickness 30T, in steps 100-155 as discussed above with respect to FIGS. 11A-11F. In step 168 of FIG. 16 and as shown in FIG. 17A, a de-wetting agent 86 is disposed on a top side of each component 30 opposite display surface 12. De-wetting agent 86 can be disposed, for example, using inkjet printing or by contacting the top side of components 30 to a substrate coated with de-wetting agent 86, transferring a portion of the coating to the top side of components 30. Display surface 12 and components 30 are uniformly blanket coated with curable layer 21 of uncured light-absorbing material to a coating thickness 20C less than component thickness 30T in step 160 (shown in FIG. 17B). The uncured light-absorbing material on components 30 wick from the top side of components 30, as shown in FIG. 17B, due to the surface energy of de-wetting agent 86 compared to the surface energy of the uncured light-absorbing material, so components 30 are exposed. Curable layer 21 of uncured light-absorbing material is cured in step 170 (for example with heat or radiation) to form layer 20 of cured light-absorbing material, so that layer 20 of cured light-absorbing material has a layer coating thickness 20C greater than zero and less than component thickness 30T and components 30 protrude from layer 20 of cured light-absorbing material.

Thus, according to some embodiments of the present disclosure, a method of making a display structure 99 comprises: providing a display substrate 10 having a display surface 12; disposing components 30 on and in contact with display surface 12, wherein components 30 are each coated with a de-wetting material; coating display surface 12 with a curable layer 21 of uncured light-absorbing material; and curing the curable layer 21 of uncured light-absorbing material to provide a layer 20 of cured light-absorbing material. At least a portion of the de-wetting material protrudes from layer 20 of cured light-absorbing material after the light-absorbing material has been cured, without having pattern-wise etched layer 20 of cured light-absorbing material. Coating display surface 12 can comprises uniformly blanket coating display surface 12.

Suitable de-wetting agents 86 can comprise hydrophobic materials or oleophobic materials, for example depending on the uncured light-absorbing material. A coated de-wetting agent 86 can be processed or otherwise treated to enhance its de-wetting properties. In general, the surface energy of de-wetting agents 86 should be lower than a surface energy of the uncured light-absorbing material. Suitable materials can include, for example polytetrafluoroethylene (PTFE) or polydimethylsiloxane (PDMS).

Certain embodiments of the present disclosure provide display construction methods requiring fewer processing steps and materials than conventional methods. Displays of the prior art typically require patterning steps to provide a black matrix structure that absorbs ambient light but does not obscure light emitted from display pixels. Such patterning steps require the use of photoresist coatings, photomasks, exposure, etching, and stripping that can all be unnecessary for embodiments of the present disclosure.

Display structure 99 can be operated by providing suitable electrical power, ground, and control signals to wires 16, for example from an external controller. Wires 16 conduct the electrical power, ground and control signals to contact pads 14 and through electrodes (shown in FIG. 11F) or connection posts 38 (shown in FIGS. 7 and 13E) to components 30. Components 30 respond to the electrical power, ground and control signals to perform their designed function, for example emitting light.

Controllers 36 can be integrated circuits comprising light-emitter control circuits formed in a semiconductor structure or substrate, for example bare-die semiconductor circuits made in monocrystalline silicon using integrated circuit and photolithographic materials and methods. The semiconductor can be, for example, silicon, CMOS, or a compound semiconductor such as GaAs. Controllers 36 can be micro-sized devices, for example having at least one of a length and a width less than 1000 microns (e.g., less than 500 microns, less than 250 microns, less than 100 microns, less than 50 microns, less than 20 microns, or less than 10 microns) and, optionally, a thickness less than 100 microns (e.g., less than 50 microns, less than 20 microns, less than 10 microns, or less than 5 microns). Controllers 36 can be micro-transfer printable elements that are micro-transfer printed from a native source wafer and therefore can include a broken (e.g., fractured) or separated controller tether 42R.

Similarly, light emitters 30R, 30G, 30B can be integrated circuits, for example micro-iLEDs, formed in a semiconductor structure or substrate, for example bare-die semiconductor circuits made in monocrystalline materials such as compound semiconductors using integrated circuit and photolithographic materials and methods. The semiconductor can be, for example, a compound semiconductor such as GaN or GaAs. Light emitters 30 can be micro-sized devices, for example having at least one of a length and a width less than 1000 microns (e.g., less than 500 microns, less than 250 microns, less than 100 microns, less than 50 microns, less than 20 microns, or less than 10 microns) and, optionally, a thickness less than 100 microns (e.g., less than 50 microns, less than 20 microns, less than 10 microns, or less than 5 microns). Such monocrystalline materials can provide faster switching speeds, greater efficiency, and reduced size compared to thin-film materials found in conventional flat-panel displays. Thus, displays having devices and structures constructed according to various embodiments of the present disclosure can have improved performance and resolution. Light emitters 30R, 30G, 30B can be micro-transfer printable components 30 that are micro-transfer printed from a native source wafer and therefore may include a broken or separated LED tether 42L. In some embodiments, components 30 or portions thereof (e.g., light emitters) have a height to width aspect ratio, a height to length aspect ratio, or both a height to width aspect ratio and a height to length aspect ratio of greater than 1 (e.g., greater than 1.5 or greater than 2). FIGS. 1-8B show such components 30.

Each light emitter 30R, 30G, 30B can be, according to various embodiments, for example, a light-emitting diode (LED), an organic light-emitting diode (OLED), a micro-LED, a laser, a diode laser, or a vertical cavity surface emitting laser and can include known light-emitting diode and/or laser materials and structures. Light emitters 30 can comprise an inorganic solid single-crystal direct bandgap light emitter, can emit visible light, such as red, green, blue, yellow, or cyan light, infrared, violet, or ultra-violet light, and can emit either coherent or incoherent light and can include phosphors, quantum dots, or other color conversion materials. Light emitters 30 used herein can have at least one of a width from 2 to 50 μm (e.g., 2 to 5 μm, 5 to 10 μm, 10 to 20 μm, or 20 to 50 μm), a length from 2 to 50 μm (e.g., 2 to 5 μm, 5 to 10 μm, 10 to 20 μm, or 20 to 50 μm), and a height from 2 to 50 μm (e.g., 2 to 5 μm, 5 to 10 μm, 10 to 20 μm, or 20 to 50 μm). A light emitter 30 or light-emitter assembly can include one or more associated color filters, for example as described in U.S. Pat. No. 10,008,483, or one or more associated color conversion materials or articles, for example as described in U.S. patent application Ser. No. 14/930,363, filed on Nov. 2, 2015.

Reference is made throughout the present description to examples of printing that are micro-transfer printing with stamp 60 comprising stamp posts 62 when describing certain examples of printing components 30 (e.g., in describing FIG. 11D). Similar other embodiments are expressly contemplated where a transfer element 60 that is not a stamp is used to similarly print components 30. For example, in some embodiments, a transfer element 60 that is a vacuum-based, magnetic, or electrostatic transfer element 60 can be used to print components 30. A component 30 can be adhered to a transfer element 60 with any type of force sufficient to maintain contact between component 30 and transfer element 60 when desired and separate transfer element 60 from component 30 when desired. For example, component 30 can be adhered to transfer element 60 with one or more of an adhesion, electrostatic, van der Waals, magnetic, or vacuum force. In some embodiments, adhesion between component 30 and transfer element 60 occurs at least in part due to a force generated by operating transfer element 60 (e.g., an electrostatic force) and separation of transfer element 60 from component 30 occurs at least in part by ceasing provision of the force (e.g., the electrostatic force). Similar transfer elements 60 can be used to print pixels 32, for example including a component substrate 34. A vacuum-based, magnetic, or electrostatic transfer element 60 can comprise a plurality of transfer posts 62, each transfer post 62 being constructed and arranged to pick up a single component 30 (similarly to stamp posts 62 in stamp 60).

Reference is made throughout to components 30. Components 30 can include one or both of one or more light emitters 30, such as organic or inorganic light-emitting diodes, and a controller 36. A component 30 can be a pixel 32. A component 30 can include a component substrate 34 on or in which one or more elements, such as light emitters 30, are disposed. Light emitters 30, controller 36, or pixel 32, can be non-native to display substrate 10 (e.g., adhesive layer 18 or support 11 thereof).

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the disclosure.

PARTS LIST 10 display substrate
11 support
12 display surface
14 contact pad
16 wires
18 adhesive layer
20 layer of light-absorbing material
20C coating thickness/first coating thickness
20R top portion
20S second coating thickness
20T layer thickness/remaining portion
21 curable layer of uncured light-absorbing material
22 second curable layer
30 component/light emitter/LED
30T component thickness
30R red-light-emitting component
30G green-light-emitting component
30B blue-light-emitting component
32 pixel
34 component substrate
36 controller
38 connection post
40 registration mark
42C component tether
42L LED tether
42R controller tether
44 pin registration structure
46 edge distance
50 barrier
60 stamp/transfer element
62 stamp post/transfer post
64 stamp body
70 etchant
80 heat
82 dielectric structure
84 electrode
86 de-wetting agent
88 optically clear electrical insulator
90 display area
92 registration area
99 display structure
100 provide display substrate step
110 provide component source substrate step
120 provide stamp step
130 pick up components with stamp step
140 print components on display substrate with stamp step 145 print components through layer of light-absorbing material onto display substrate with stamp step
150 remove stamp step
155 form electrical connections step
158 dispose optically clear electrical insulator step
160 dispose layer of light-absorbing material over display substrate and components step
165 dispose layer of light-absorbing material over display substrate step
168 dispose de-wetting agent on top side of component step
170 cure light-absorbing material step
180 remove portion of layer of light-absorbing material step
200 align components to display substrate step
210 contact components to display substrate step

The invention claimed is:

1. A method of making a display structure, comprising:
providing a display substrate having a display surface;
disposing components on and in contact with the display surface, wherein the components are each coated with a de-wetting material;
coating the display surface with a curable layer of uncured light-absorbing material; and
curing the curable layer of uncured light-absorbing material to provide a layer of cured light-absorbing material,
wherein at least a portion of the de-wetting material protrudes from the layer of cured light-absorbing material after the light-absorbing material has been cured, without having pattern-wise etched the layer of cured light-absorbing material.

2. The method of claim 1, wherein coating the display surface comprises uniformly blanket coating the display surface.

3. A display structure comprising:
a display substrate having a display surface;
one or more contact pads disposed in or on the display surface;
pixels disposed on the display surface, wherein each of the pixels comprises a component substrate, two or more light emitters disposed on a side of the component substrate opposite to the display substrate, and one or more electrically conductive connection posts disposed on a side of the component substrate adjacent to the display substrate, wherein the two or more light emitters are non-native to the component substrate; and
a layer of cured light-absorbing material disposed on the display substrate,
wherein each of the one or more connection posts extends through the layer of cured light-absorbing material and is in electrical and physical contact with one of the one or more contact pads, and
wherein the two or more light emitters protrude from the layer of cured light-absorbing material.

4. The display structure of claim 3, wherein the layer of cured light-absorbing material (i) is in contact with, (ii) covers, or (iii) is in contact with and covers the component substrate of each of the pixels.

5. The display structure of claim 3, wherein a top surface of the layer of cured light-absorbing material is above a top surface of the component substrate of each of the pixels.

6. The display structure of claim 3, wherein the pixels each comprise a controller.

7. The display structure of claim 6, wherein the layer of cured light-absorbing material (i) is in contact with, (ii) covers, or (iii) is in contact with and covers the controller.

8. The display structure of claim 3, wherein the two or more light emitters each have one or more of (i) a height to width aspect ratio and (ii) a height to length aspect ratio of greater than 1.

9. The display structure of claim 3, wherein only the two or more light emitters protrude from the layer of cured light-absorbing material after the curing.

10. The display structure of claim 3, wherein the layer of cured light-absorbing material comprises a plurality of successively formed sublayers of cured light-absorbing material.

11. A display structure comprising:
a display substrate having a display surface;
one or more light emitters disposed on and in contact with the display surface;
an optically clear electrical insulator disposed over each of the one or more light emitters; and
a uniformly coated layer of light-absorbing material, wherein the one or more light emitters, the optically clear electrical insulator, or both the one or more light emitters and the optically clear electrical insulator protrude through the uniformly coated layer of light-absorbing material and the optically clear electrical insulator is a de-wetting material for the light-absorbing material.

12. The display structure of claim 11, wherein the display substrate comprises an adhesive layer and a surface of the adhesive layer is the display surface.

13. The display structure of claim 11, wherein the optically clear electrical insulator is disposed in a patterned layer.

14. The display structure of claim 11, wherein the optically clear electrical insulator is disposed in an unpatterned layer.

15. The display structure of claim 11, wherein the one or more light emitters are disposed on a component substrate disposed on the display surface.

16. The display structure of claim 15, comprising a controller disposed on the component substrate.

17. The display structure of claim 11, wherein the one or more light emitters are electrically connected to one or more contact pads disposed on or in the display surface through one or more connection posts.

18. A display structure comprising:
a display substrate having a display surface and that comprises one or more registration areas and a separate display area;
a registration mark or a pin registration structure disposed in each of the one or more registration areas;
components disposed on and in contact with the display surface;
a layer of light-absorbing material having a uniform thickness disposed on the display surface, wherein the layer of light-absorbing material is in contact with the components and the components protrude from the layer of light-absorbing material; and
a corresponding barrier for each of the one or more registration areas, wherein the layer of light-absorbing material is in contact with the barrier and is not in contact with at least a portion of the registration area.

19. A display structure comprising:
a display substrate having a display surface and that comprises one or more registration areas and a separate display area;
a registration mark or a pin registration structure disposed in each of the one or more registration areas;

components disposed on and in contact with the display surface; and a layer of light-absorbing material having a uniform thickness disposed on the display surface, wherein the layer of light-absorbing material is in contact with the components and the components protrude from the layer of light-absorbing material, wherein the layer of light-absorbing material is in contact with the registration mark or the pin registration structure.

20. The display structure of claim 18, wherein the registration mark is disposed in each of the one or more registration areas.

21. The display structure of claim 18, wherein the pin registration structure is disposed in each of the one or more registration areas.

22. The display structure of claim 19, wherein the light-emitting components are pixels each comprising one or more light emitters and the one or more light emitters protrude from the layer of light-absorbing material.

23. The display structure of claim 22, wherein the pixels each comprise a component substrate on which the light emitters are disposed and the layer of light-absorbing material (i) is in contact with, (ii) covers, or (iii) is in contact with and covers the component substrate.

24. The display structure of claim 22, wherein the pixels each comprise a controller and the layer of light-absorbing material (i) is in contact with, (ii) covers, or (iii) is in contact with and covers the controller.

* * * * *